United States Patent
Neidorff

(10) Patent No.: US 12,132,393 B2
(45) Date of Patent: Oct. 29, 2024

(54) ADAPTING SPLIT-TRANSISTOR SWITCHING POWER SUPPLY BASED ON CONDITION

(71) Applicant: Texas Instruments Incorporated, Dallas, TX (US)

(72) Inventor: Robert A. Neidorff, Bedford, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 213 days.

(21) Appl. No.: 17/809,238

(22) Filed: Jun. 27, 2022

(65) Prior Publication Data

US 2023/0421049 A1  Dec. 28, 2023

(51) Int. Cl.
  *H02M 1/00* (2007.01)
  *H02M 1/088* (2006.01)
  *H02M 3/158* (2006.01)

(52) U.S. Cl.
  CPC ......... *H02M 1/088* (2013.01); *H02M 1/0012* (2021.05); *H02M 3/158* (2013.01)

(58) Field of Classification Search
  CPC ..... G05F 1/00; G05F 1/10; G05F 1/12; G05F 1/46; G05F 1/455; G05F 1/45;
  (Continued)

(56) References Cited

U.S. PATENT DOCUMENTS 6,917,227 B1 *  7/2005  Ochi ................. H03K 17/0822
                                                327/377
7,746,123 B2    6/2010  Hester et al.
(Continued)

FOREIGN PATENT DOCUMENTS

CN    101577482 B  *  5/2012  ............. H02M 1/08
CN    112366943 A  *  2/2021  ........... H02M 1/088
(Continued)

OTHER PUBLICATIONS

CN 112366943 English Translation (Year: 2021).*
(Continued)

*Primary Examiner* — Thienvu V Tran
*Assistant Examiner* — Nusrat Quddus
(74) *Attorney, Agent, or Firm* — Charles F. Koch; Frank D. Cimino

(57) ABSTRACT

Techniques for controlling a switching converter. In an example, the converter includes a switching element and a logic circuit. The switching element includes a plurality of parallel-coupled transistors. The logic circuit is configured to initially provide one or more gate drive signals to one or more of the parallel-coupled transistors, respectively, but not to all of the transistors. After a delay period, the logic circuit is further configured to provide a respective gate drive signal to all or an otherwise larger number of the transistors. The initially-provided one or more gate signals is/are based on one or more conditions associated with the converter, such as RdsOn associated with the switching element and/or temperature. In this manner, a switching transistor that is adaptively-sized based on the condition(s) is initially switched to damp ringing, and a larger switching transistor (e.g., all transistors in parallel) is subsequently switched for low conduction loss.

25 Claims, 9 Drawing Sheets

(58) Field of Classification Search
CPC ... G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; G05F 1/30; G05F 1/33; G05F 1/32; G05F 1/34; G05F 1/38; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/158; H02M 3/1588; H02M 2003/1566; H02M 3/1582; H02M 2003/1557; H02M 3/1584; H02M 3/285; H02M 3/33561; H02M 7/49; H02M 1/045; H02M 7/006; H02M 7/06; H02M 7/068; H02M 7/153; H02M 7/10; H02M 1/088; H02M 7/103; H02M 7/106; H02M 7/19; H02M 7/08; H02M 7/17; H02M 2001/007; H02M 7/493; H02M 7/53806; H02M 7/5381; H02M 7/483; H02M 7/217; H02M 7/538466; H02M 7/5387; H02M 7/53871; H02M 7/53873; H02M 7/53875; H02M 1/084; H02M 1/0845; H02M 3/07; H02M 3/073; H02M 2003/071; H02M 2003/072; H02M 2003/075; H02M 2003/076; H02M 2003/077; H02M 2003/078; H02M 2001/0048; H02M 1/12; H02M 3/3155; H02M 3/33507; H02M 3/33546; H02M 7/1557; H02M 7/1626; H02M 1/4208; H02M 7/219; H02M 7/151; H02M 1/4233; H02M 5/4585; H02M 1/08; H02M 7/1552; H02M 7/1623; H02M 1/4225; H02M 3/33592; H02M 3/137; H02M 7/00; H02M 7/064; H02M 1/42; H02M 1/4216; H02M 1/4241; H02M 1/425; H02M 1/4258; H02M 1/4266; H02M 2001/4275; H02M 2001/4283; H02M 2001/4291; H05B 39/048; B23K 11/24; H04B 2215/069; H02J 3/46; H02J 3/38; H02J 7/12

See application file for complete search history.

(56) References Cited

U.S. PATENT DOCUMENTS

| | | | |
|---|---|---|---|
| 7,800,350 B2* | 9/2010 | Pigott | H02M 3/1588 323/271 |
| 8,604,717 B2 | 12/2013 | Lee | |
| 8,817,497 B2 | 8/2014 | Zheng et al. | |
| 9,793,806 B2 | 10/2017 | Chang | |
| 10,673,432 B1* | 6/2020 | Kaya | H02M 3/158 |
| 11,159,032 B2* | 10/2021 | Womac | H02M 7/48 |
| 11,264,983 B1 | 3/2022 | Kaya | |
| 2001/0005028 A1* | 6/2001 | Shimoida | H03K 17/0826 257/350 |
| 2009/0140708 A1* | 6/2009 | Tateishi | H02M 3/1588 323/282 |
| 2014/0176093 A1* | 6/2014 | Nomiyama | H03K 17/122 323/235 |
| 2019/0326887 A1* | 10/2019 | Kaya | H03K 17/145 |
| 2020/0212809 A1* | 7/2020 | Baranwal | H02M 1/088 |
| 2021/0013805 A1 | 1/2021 | Neidorff et al. | |
| 2021/0099070 A1* | 4/2021 | Sahni | H02M 3/158 |
| 2022/0209667 A1* | 6/2022 | Neidorff | H02M 1/44 |

FOREIGN PATENT DOCUMENTS

| | | |
|---|---|---|
| WO | 2004006037 W | 1/2004 |
| WO | 2018158726 A1 | 9/2018 |

OTHER PUBLICATIONS

CN 101577482 English Translation (Year: 2012).*
Luo Ping et al: "Digital assistant current sensor for PWM DC-DC converter with segmented output stage", 2013 International Conference On Communications, Circuits and Systems (ICCCAS), IEEE, vol. 2, Nov. 15, 2013 (Nov. 15, 2013), pp. 358-361, XP032578422, DOI: 10.1109/ICCCAS.2013.6765356.
Ming Luo et al: "An adaptive segment output stage for PWM DC-DC converter", Solid-State and Integrated Circuit Technology (ICSICT), 2012 IEEE 11th International Conference On, IEEE, Oct. 29, 2012 (Oct. 29, 2012), pp. 1-3, XP032334695, DOI: 10.1109/ICSICT.2012.6467721 ISBN: 978-1-4673-2474-8.
PCT Search Report for T101256WO01, dated Oct. 10, 2023.
Wang, et al., "Parameter-Specific Ring Oscillator for Process Monitoring at the 45 nm Node," IEEE, (2010). 4 pages.
Vermeire, et al., "Die-level process monitor for mixed signal designs," IoT PLL. Downloaded from Internet on Apr. 25, 2022, at URL: https://www.design-reuse.com/articles/9663/die-level-process-monitor-for-mixed-signal-designs.html. Publication date unknown. 5 pages.
Payne, Daniel, "Why It's a Good Idea to Embed PVT Monitoring IP in SoCs," Moortec, Feb. 16, 2018. 6 pages.

* cited by examiner

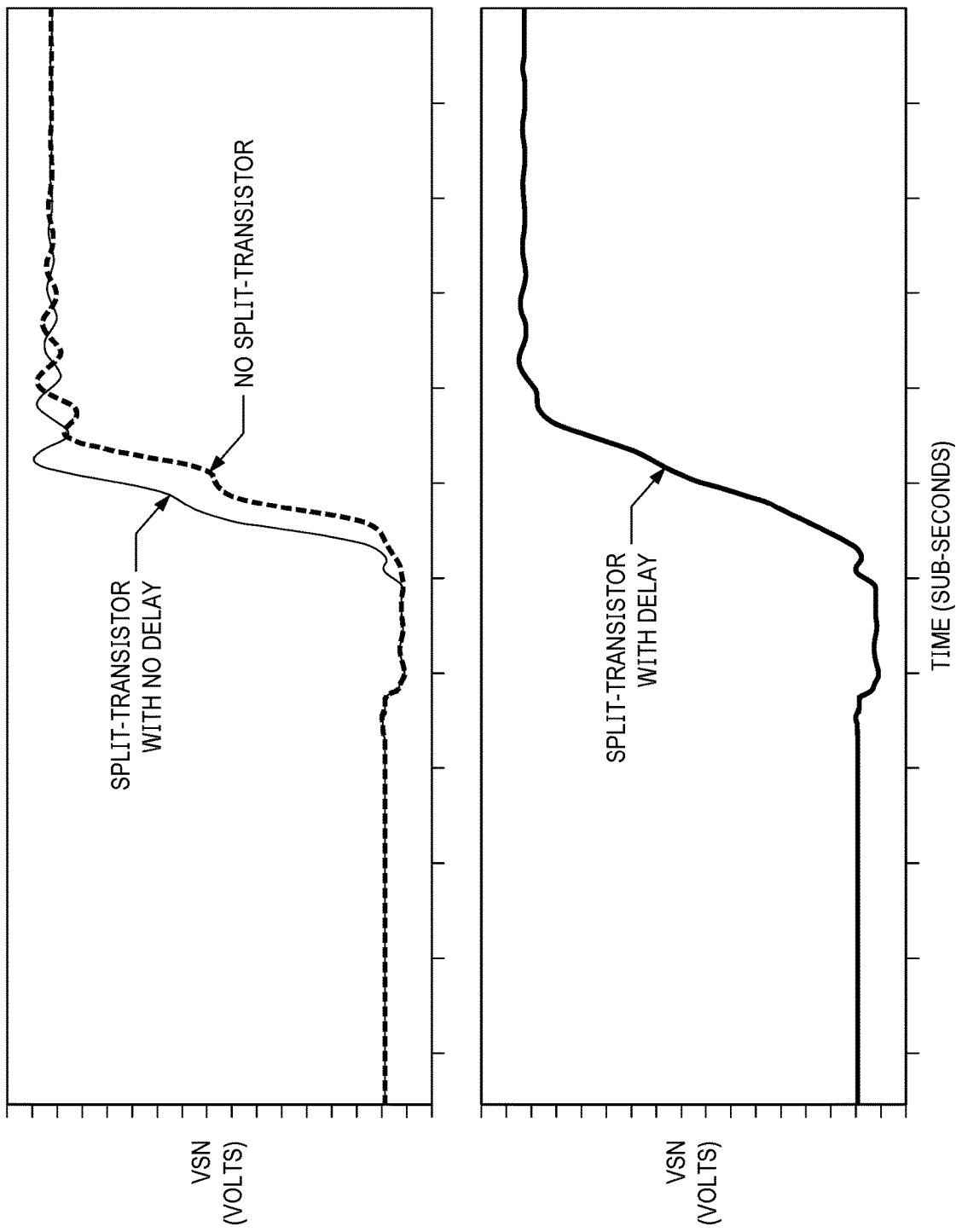

ADAPTING SPLIT-TRANSISTOR SWITCHING POWER SUPPLY BASED ON CONDITION

TECHNICAL FIELD

This description relates to switching power supplies, and more particularly, to techniques for adapting split-transistor switching power supplies based on a condition such as temperature and/or process strength.

BACKGROUND

A switching power supply is commonly used to transfer power from an AC or DC input power source to a DC load by switching one or more power transistors (such as metal oxide semiconductor field effect transistors, MOSFETs) coupled via a switching node to an energy storage element (such as an inductor, a transformer via an inductance of the transformer, and/or a capacitor), which in turn is capable of coupling to a load. A switching power supply may further include a controller that provides drive signals to a corresponding gate of a given power transistor. During operation of the power supply, the power transistor(s) are switched on or off which causes rapid changes in current, generally referred to as switching current. The switching current can cause ringing to manifest at the output of the power supply. Accordingly, a number of non-trivial issues remain with switching power supplies.

SUMMARY

Techniques are described herein to adapt split-transistor switching power supplies based on one or more conditions, such as temperature and/or process strength. Other conditions that may inform the adaptation include ringing amplitude, input voltage, load current, and/or switching speed, to name a few examples.

In an example, a switching power supply includes a switching element and a logic circuit. The switching element includes two or more parallel-coupled transistors. The logic circuit has a first logic circuit input, a second logic circuit input, and a logic circuit output. The logic circuit is configured to: (a) receive at the first logic circuit input a pulse width modulation (PWM) signal, (b) receive at the second logic circuit input a logic control signal that is based on one or more conditions, and (c) provide from the logic circuit output to a gate of one of the two or more parallel-coupled transistors a gate control signal that is based on both the PWM signal and the logic control signal. In one such example, one or more conditions on which the logic control signal is based include one or both of process strength associated with the switching element and ambient temperature associated with the power supply. Other conditions may be used (e.g., ringing amplitude, input voltage, load current, and/or switching speed).

Another example is a switching power supply that includes a switching element and a logic circuit. The switching element includes a plurality of parallel-coupled transistors. The logic circuit is configured to: (a) initially provide one or more gate drive signals to one or more of the parallel-coupled transistors, respectively, but not to all of the parallel-coupled transistors, and (b) after a delay period provide a respective gate drive signal to each of the parallel-coupled transistors, the initially-provided one or more gate signals being based on one or more conditions. In some such examples, the one or more conditions may include one or more of drain-to-source on-resistance (RdsOn) associated with the switching element, ambient temperature associated with the power supply, ringing amplitude, input voltage, load current, and/or switching speed.

Another example is method for controlling a switching power supply that includes a switching element having two or more parallel-coupled transistors. The method includes receiving a pulse width modulation (PWM) control signal, and generating a logic control signal that is based on one or both of process strength associated with the switching element and ambient temperature associated with the power supply. Responsive to the logic control signal indicating that the process strength and/or ambient temperature is beyond a given threshold, the method includes initially providing one or more gate drive signals to a first set of the two or more parallel-coupled transistors, respectively, the first set including one or more but not all of the two or more parallel-coupled transistors, and after a delay period providing a respective gate drive signal to each of the two or more parallel-coupled transistors. Responsive to the logic control signal indicating that the process strength and/or ambient temperature is not beyond a given threshold, the method includes initially providing one or more gate drive signals to a second set of the two or more parallel-coupled transistors, respectively, the second set having one or more fewer transistors than the first set or one or more different transistors than the first set, and after a delay period providing a respective gate drive signal to each of the two or more parallel-coupled transistors. In other examples, the logic control signal may be based on conditions other than process strength and/or temperature (or in addition to process strength and/or temperature), such as ringing amplitude, input voltage, load current, and/or switching speed.

BRIEF DESCRIPTION OF THE DRAWINGS

FIG. 1E comparatively illustrates example switching power supply output waveforms with ringing undamped and damped, in an example.

DETAILED DESCRIPTION

Figure 1A:
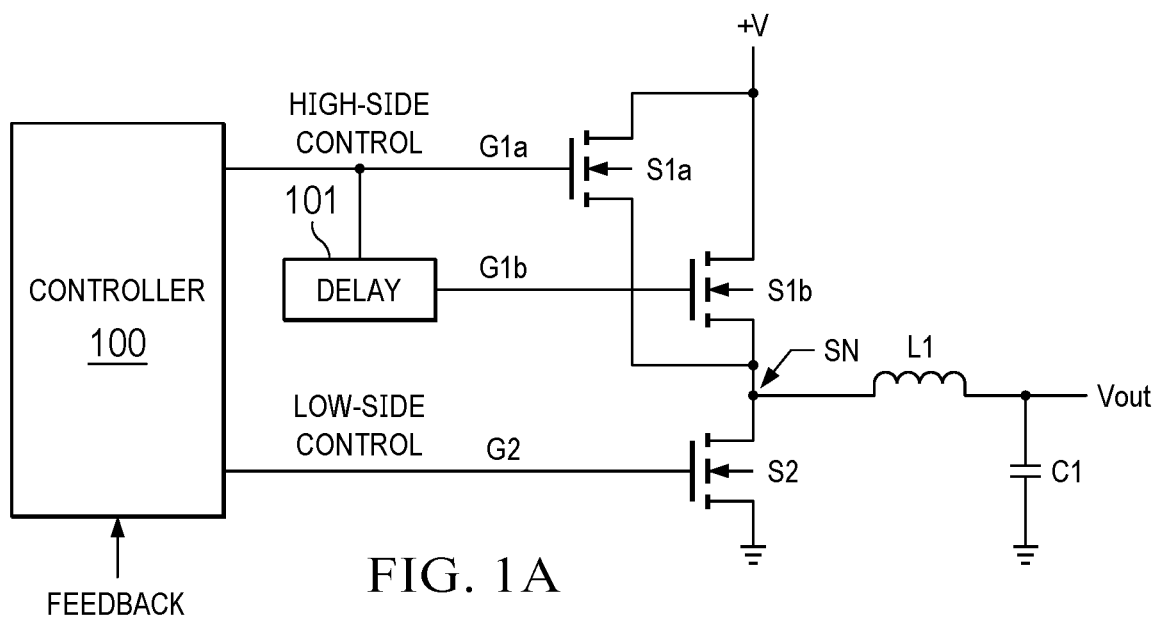
FIG. 1A illustrates a split-transistor switching power supply configured in an example.

Techniques are described herein for controlling a switching power supply (sometimes called a converter or regulator, which are interchangeable). The techniques can be used with any switching power supply topologies, such as buck, boost, buck-boost, flyback, half-bridge, and full-bridge. Such power supplies generally include at least one switching element coupled between a voltage supply node (voltage supply terminal or voltage reference terminal) and a switching node. In an example, the switching power supply includes a switching element and a logic circuit. The switching element includes a plurality of parallel-coupled transistors. The logic circuit is configured to initially provide one or more gate drive signals to one or more of the parallel-coupled transistors, respectively, but not to all of the parallel-coupled transistors. After a delay period, the logic circuit is further configured to provide a respective gate drive signal to each (all) of the parallel-coupled transistors. The initially-provided one or more gate signals is/are based on one or more conditions associated with the power supply, such as one or both of process strength (e.g., drain-to-source on-resistance, RdsOn, or other suitable indicator of process strength, such as transistor drive current, Id) associated with the switching element and ambient temperature associated with the power supply. In this manner, the initially-switched switching transistor is adaptively-sized based on temperature and/or process strength (and/or on or more other conditions associated with the power supply, such as ringing amplitude, input voltage, load current, and/or switching speed) so as to damp ringing, and a relatively larger switching transistor (e.g., all transistors in parallel) is subsequently switched for low conduction loss. The initially-switched switching transistor can be selected, for instance, from two or more possible choices. So, the split-transistor ratio (transistor$_{final\_size}$: transistor$_{initial\_size}$) of the split-transistor power supply can be adaptively and automatically selected from two or more choices based on the one or more conditions. The conditions are local to the power supply and the given application.

General Overview

As described above, there remain a number of non-trivial issues associated with switching power supplies. For instance, during operation a switching power supply turns on and off power switches (e.g., MOSFETs, or power FETs) to redirect current from one power conductor (e.g., switching node) to another (e.g., inductor). Because the power conductors have inductance and stray capacitance that effectively form small resonant circuits, the switching current causes ringing to manifest on the switching node and output of the power supply, which in turn can cause electromagnetic interference (EMI) and over-voltage stress. Exacerbating the situation is that the ringing increases in magnitude as resistance and capacitance decrease (there is a trade-off between undesirable ringing and desirable low parasitics). Some possible solutions to this ringing include driving the power FETs more slowly and/or clamping the ringing. However, such approaches tend to increase loss within the power supply. Another possible solution that is less susceptible to such loss might be to use a split-FET arrangement, in which two smaller power FETs are connected in parallel instead of using a single larger FET, for a given power switch. The two smaller FETs each have a larger on-resistance (RdsOn) as compared to the on-resistance of a single larger FET formed by the parallel combination of the two smaller FETs. By switching the two FETs on at slightly different times, the initial output slewing of the power supply is accomplished by just one of the FETs, and full-conduction is subsequently accomplished by both the FETs connected in parallel. The result is that the ringing during the initial output slewing can be dampened or otherwise reduced by the relatively larger on-resistance of the single FET that is initially switched. Such a split-FET configuration works well, but can be limited because the first-switched FET must be large enough to handle all of the current, not only under ideal conditions but also under less than ideal conditions, such as worst-case temperature and worst-case process variation. For instance, consider the FET performance impact in the context of heat-intensive applications such as automotive (e.g., where power supply is deployed near the engine), relative to refrigerated or otherwise cooler applications. Likewise, consider that RdsOn and other such FET performance parameters may vary from one FET to the next, due to process variation. For instance, FETs from the same wafer lot or die may tend to have similar or proportional RdsOn values, but FETs from different wafer lots or dies may have RdsOn values that are quite different (e.g., ~25% variance).

Accordingly, techniques are described herein for controlling a switching power supply. In an example, a switching power supply includes a switching element and a logic circuit. The switching element includes two or more parallel-coupled transistors coupled between a voltage supply node (voltage supply terminal or voltage reference terminal) and a switching node. The logic circuit is configured to initially provide one or more gate drive signals to one or more of the parallel-coupled transistors, respectively, but not to all of the parallel-coupled transistors. After a delay period, the logic circuit is further configured to provide a respective gate drive signal to each of the parallel-coupled transistors. In some examples, the initially-provided one or more gate signals is/are based on one or both of process strength associated with the switching element (e.g., low RdsOn equals strong process, and high RdsOn equals weak process) and ambient temperature associated with the power supply. In this manner, the split-transistor ratio (transistor$_{final\_size}$: transistor$_{initial\_size}$) of the split-transistor power supply can be adaptively and automatically selected from two or more choices based on temperature and/or process strength. The number of split-transistor ratios available for selection can range from two or more.

For example, assume that the switching element has a total of three parallel-coupled field effect transistors (FETs), including two 1X-sized transistors and one 6X-sized transistor. The FET size X may refer, for instance, to gate width or some other dimension that correlates to a device strength of interest. In one example such scenario, responsive to the ambient temperature being higher than a temperature threshold (high-temp condition) and/or the RdsOn being higher than an on-resistance threshold (weak process condition), both of the two smaller (1X) transistors initially receive respective gate drive signals, and then after the delay period all three of the transistors receive respective gate drive signals. So, the split-transistor ratio would be 4:1. In more detail, the final size transistor (transistor$_{final\_size}$) includes all three transistors (1X+1X+6X=8X) and the initial size transistor (transistor$_{initial\_size}$) includes only the smaller two transistors (1X+1X=2X), which provides a ratio of 8:2, which reduces to 4:1. This is one possible split-transistor ratio for such a configuration.

Continuing with the example, responsive to the ambient temperature being lower than a temperature threshold (low-temp condition) and/or the RdsOn being lower than an on-resistance threshold (strong process condition), only one of the smaller (1X) transistors initially receives a gate drive signal, and then after the delay period all three of the transistors receive respective gate drive signals. So, the split-transistor ratio would be 8:1. Specifically, the final size transistor includes all three transistors (1X+1X+6X=8X) and the initial size transistor includes only one of the smaller transistors (1X), which provides a ratio of 8:1. This is a second possible split-transistor ratio for such a configuration. Other examples may have additional split-transistor ratios that can be selected by the logic circuit based on one or both of process strength and ambient temperature, depending on the number of transistors included in the switching element.

As described above, the split-transistor ratio can be selected based on one or both of process strength and ambient temperature. The ambient temperature and process strength can be measured in real-time, or measured in advance and stored in a memory, or predicted based on theoretical and/or empirical analysis and stored in a memory, according to some examples.

In one such example case, the ambient temperature is measured in real-time by a temperature sensor, and the output signal of the temperature sensor is compared to a temperature reference signal by a comparator circuit. In some example cases, the temperature reference signal can be fixed (e.g., 60° C.), and in other example cases the temperature reference signal can be a variable (e.g., 60° C. or 90° C.) that is selected based on one or more other signals. In some such examples, for instance, the temperature reference signal can be selected based on process strength (e.g., RdsOn), such that the split-transistor ratio is determined by a Boolean of temperature and process strength. Regardless of whether the temperature reference signal is fixed or variable, the temperature reference signal can be stored in a memory and accessed for purposes of assessing a stored or real-time measured ambient temperature. In some examples, the temperature comparator circuit can be adjusted or trimmed (e.g., with calibration data derived from testing and stored in memory) to improve its accuracy across a range of temperature or other such environmental factors.

Similarly, the process strength can be measured in real-time by a process strength sensor, and the output signal of the process strength sensor is compared to a process strength reference signal by a comparator circuit. In some example cases, the process strength reference signal can be fixed (e.g., 5 ohms, for RdsOn), and in other example cases the process strength reference signal can be a variable (e.g., 2.5 ohms or 5 ohms, for RdsOn) that is selected based on one or more other signals. In some such examples, for instance, the process strength reference signal can be selected based on the ambient temperature (e.g., measured or predicted), such that the split-transistor ratio is determined by a Boolean of process strength and temperature. Regardless of whether the process strength reference signal is fixed or variable, the process strength reference signal can be stored in a memory and accessed for purposes of assessing a stored or real-time measured process strength. In some examples, the process strength comparator circuit can be adjusted or trimmed (e.g., with calibration data derived from testing and stored in memory) to improve its accuracy across a range of temperature or other such environmental factors.

The techniques can be used, for example, in any application that uses a switching power supply and is susceptible to ringing as well as temperature and/or process strength variations (e.g., automotive applications, radar systems, vision systems such as those used in robotics and autonomous driving, gaming and infotainment systems, communication systems, to name a few examples). The split-transistor switching element helps to reduce ringing, and adapting the split-transistor ratio based on temperature and/ or process strength further helps reduce ringing across temperature and process strength variation. More generally, the split-transistor ratio can be adapted based on any number of conditions local to the power supply. For instance, any one or more of switching element process strength (e.g., RdsOn), ambient temperature, ringing amplitude at the supply output, power supply input voltage (e.g., +V), load current level, and/or switching speed can be taken into consideration as part of the decision tree to select an appropriate split-transistor ratio. Moreover, the techniques may also help reduce power dissipation (e.g., caused by high RdsOn). The techniques can be implemented with no or minimal impact to cost and footprint, and do not require switching speeds to be slowed (no need to drive transistors slower).

Circuit Architecture

FIG. 1A illustrates a split-transistor switching power supply configured in an example. The power supply includes a high-side/low-side buck converter configuration operatively coupled to a controller 100, although any number of switching power supply topologies can be used as described above. In this example, inductor L1 and capacitor C1 form a tank circuit connected to the switching node SN and provide energy storage during switching operations. The high-side switching element is implemented as a split-transistor having a fixed ratio (transistor$_{final\_size}$: transistor$_{initial\_size}$) and which includes parallel-coupled FETs S1a and S1b. A delay circuit 101 allows S1b to be gated slightly after S1a is gated. The low-side switching element is implemented with a single FET S2. The high-side switching element is connected between the switching node SN and a supply node (which is +V in this example), and the low-side switching element is connected between the switching node and power reference node (which is ground in this example).

Controller 100 can be any standard or proprietary controller, such as a pulse width modulation (PWM) controller that generates control signals based on feedback representative of output voltage Vout. In another example, the low-side switching element may be implemented with a split-transistor configuration instead of the high-side switching element. In still another example, both the low-side and high-side switching elements can be implemented with a split-transistor. In any such cases, the controller 100 generates high-side and low-side PWM control signals based on feedback representative of output voltage Vout. The feedback allows Vout to be adjusted as needed by changing the ON-time of the switching elements.

Delay circuit 101 may be any standard or proprietary delay circuit, such as a rising edge delay circuit. The amount of delay provided by delay circuit 101 can vary from one example to the next but in some examples is in the range of 3 nanoseconds (ns) to 30 ns. In one such example, the delay period is 10 ns (+/−1 ns). In some examples, the delay period provided by delay circuit 101 can be tuned or otherwise adjusted to a desired delay amount or range.

In one example, FETs S1a and S1b are the same size (e.g., 1X), although they are not required to be the same size. In any such cases, each of FETs S1a and S1b has a larger on-resistance (e.g., 1X size FET has an RdsOn=R) as compared to the on-resistance of a single larger FET formed by the parallel combination of FETs S1a and S1b (e.g., 2X size FET has an RdsOn=R/2, assuming they are both 1X). By switching FET S1a on before switching S1b on, the initial output slewing of the power supply is accomplished by FET S1a only, and full-conduction is subsequently accomplished by both FETs S1a and S1b connected in parallel. The result is that the ringing (at switching node SN) during the initial output slewing can be dampened or otherwise reduced by the relatively larger on-resistance RdsOn of FET S1a that is initially switched.

In more detail, ringing at the switching node SN is proportional to the quality factor at the switch node, which is approximately represented by $$Q = \frac{1}{R}\sqrt{\frac{L}{C}},$$

where Q is the quality factor, R is an effective resistance that exists at switching node SN (including the on-resistance of the active switching element and any parasitic resistance), L is an effective inductance that exists in series with the switched transistor (parasitic inductance), and C is an effective capacitance that exists at switching node SN (parasitic capacitance). The voltage ringing, in some implementations, is at a frequency sufficient to cause EMI that can exceed specified limits of a given application. These limits can be specified, in various examples, by regulatory or governing bodies, industry standards, or other applicable specifications. By increasing the on-resistance (RdsOn) of the active switching element coupled to switching node SN, the quality factor Q decreases in value which in turn decreases the amplitude of voltage ringing at switching node SN.

Figure 1B:
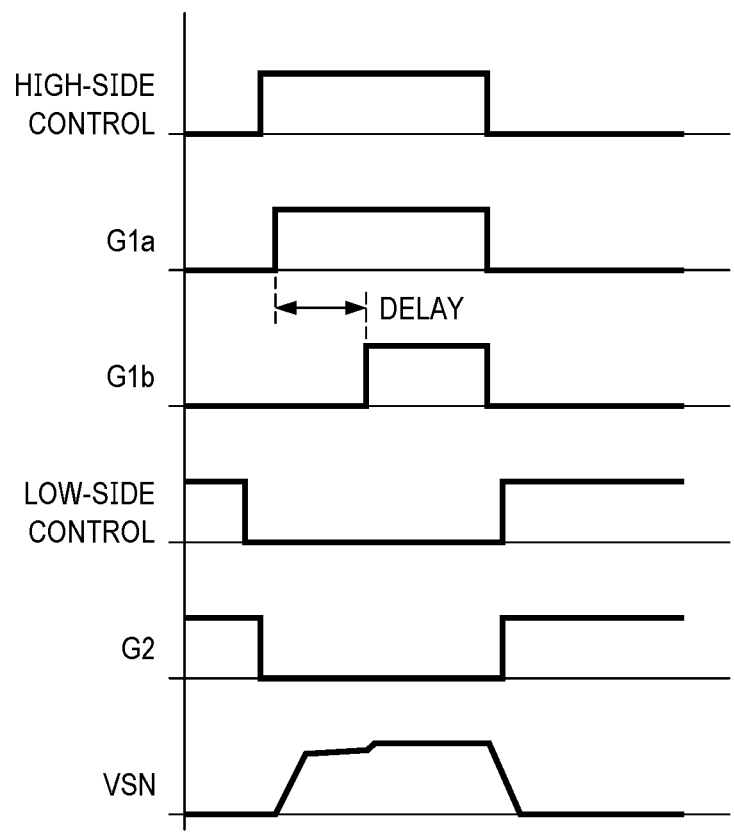
FIG. 1B illustrates example waveforms of the split-transistor switching power supply of FIG. 1A.

FIG. 1B illustrates example waveforms of the split-transistor switching power supply of FIG. 1A. In this example, controller 100 generates a pulse-width modulation (PWM) control signal G1a, which is applied (directly or via a driver) to the gate of S1a of the high-side switching element and to the input of delay circuit 101. The delay circuit 101 in turn generates PWM control signal G1b, which is applied (directly or via a driver) to the gate of S1b of the high-side switching element. Controller 100 also generates a PWM control signal G2, which is applied (directly or via a driver) to the gate of S2 of the low-side switching element. Controller 100 is configured such that the high-side switching element (S1a and S1b) is not active at the same time as the low-side switching element (S2), and vice-versa. As further shown in the example of FIG. 1B, delay circuit 101 is a rising edge delay circuit in which the output of delay circuit 101 follows the input of delay circuit 101 high after the delay period (e.g., 10 ns), and remains high until the input of delay circuit 101 falls. So, in this example case, responsive to the high-side control signal transitioning high, control signal G1a initially transitions high to turn on FET S1a, and after the delay period control G1b transitions high to turn on FET S1b. Responsive to the high-side control signal transitioning low, both G1a and G1b transition low. Low-side switching can then take place in turn, and so on. The resulting voltage VSN at the switching node SN rises and falls accordingly, to provide an efficiently regulated output voltage Vout. As described above, the low-side switching element can be implemented with a split FET as well, or instead of the high-side switching element.

Figure 1C:
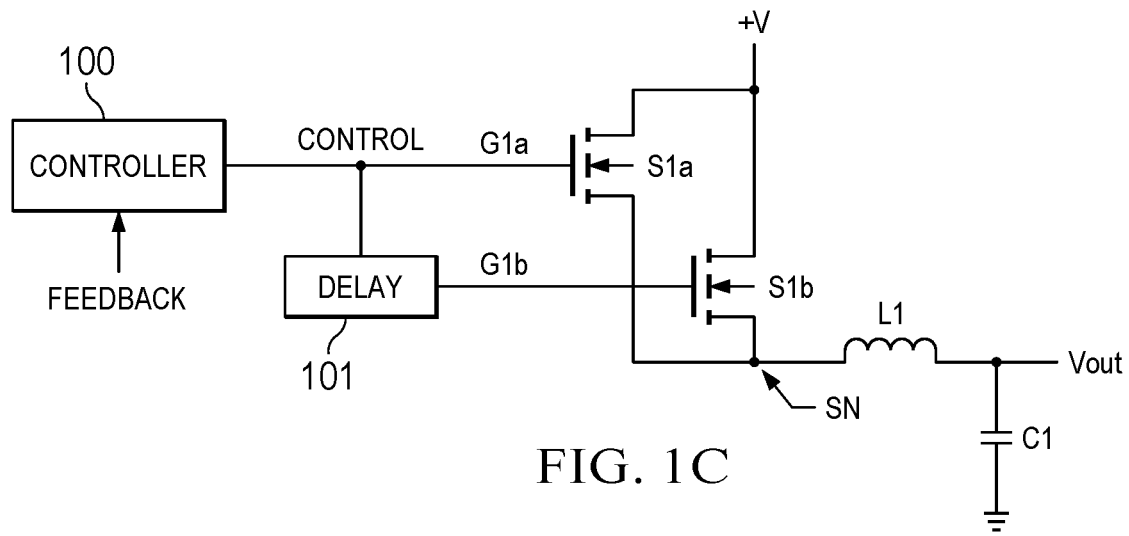
FIG. 1C illustrates a split-transistor switching power supply configured in another example.

FIG. 1C illustrates a split-transistor switching power supply configured in another example. The power supply of this example is similar to the configuration shown in FIG. 1A, except there is only one switching element instead of high-side and low-side switching elements. Further recall that, as described above, the power supply may have any number of other switching power supply topologies (e.g., buck, boost, buck-boost, flyback, half-bridge, and full-bridge), and the techniques described herein may be similarly applied. In this example, the sole switching element is implemented as a split-transistor having a fixed ratio (transistor$_{final\_size}$:transistor$_{initial\_size}$) which includes parallel-coupled field effect transistors (FETs) S1a and S1b. A delay circuit 101 allows S1b to be gated slightly after S1a is gated. The switching element in this example is connected between the switching node SN and a supply node (which is +V in this example). The above relevant description with respect to controller 100, delay circuit 101, and the control of FETs S1a and S1b to provide a regulated output voltage with reduced ringing is equally applicable here.

Figure 1D:
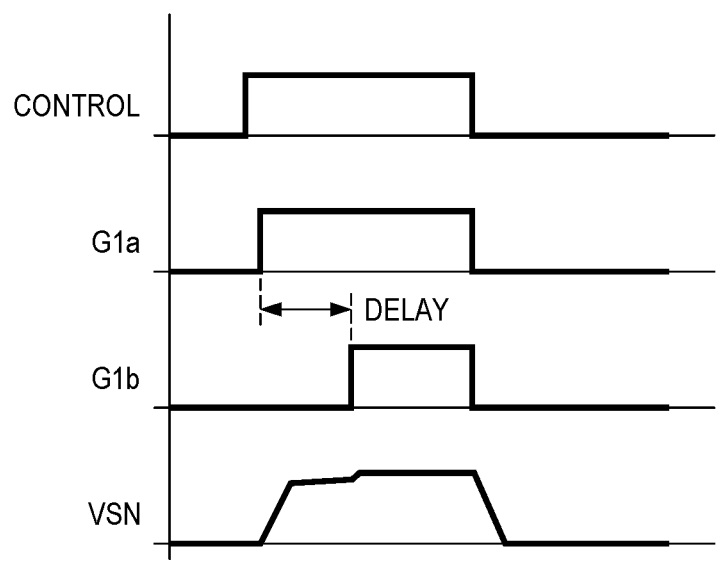
FIG. 1D illustrates example waveforms of the split-transistor switching power supply of FIG. 2A.

FIG. 1D illustrates example waveforms of the split-transistor switching power supply of FIG. 1C. In this example, controller 100 generates a pulse-width modulation (PWM) control signal G1a, which is applied (directly or via a driver) to the gate of S1a of the switching element and to the input of delay circuit 101. The delay circuit 101 in turn generates PWM control signal G1b, which is applied (directly or via a driver) to the gate of S1b of the switching element. As further shown in the example of FIG. 1D, delay circuit 101 is a rising edge delay circuit in which the output of delay circuit 101 follows the input of delay circuit 101 high after the delay period (e.g., 10 ns), and remains high until the input of delay circuit 101 falls. So, in this example case, responsive to the control signal transitioning high, control signal G1a initially transitions high to turn on FET S1a, and after the delay period control G1b transitions high to turn on FET S1b. Responsive to the control signal transitioning low, both G1a and G1b transition low. The resulting voltage VSN at the switching node SN rises and falls accordingly, to provide an efficiently regulated output voltage Vout.

FIG. 1E comparatively illustrates example switching power supply output waveforms with ringing undamped and damped, in an example. As shown in the top portion of the comparison, the waveform labeled no split-transistor was generated with a standard switching power supply having a single transistor switching element (e.g., single size 212X transistor). Note the magnitude of the initial voltage ringing. As further shown in the top portion of the comparison, the waveform labeled split-transistor with no delay was generated with a switching power supply having a switching element implemented with a split-transistor but no delay in between switching the individual transistors of that split transistor (e.g., size 62X transistor parallel-connected with size 150X transistor, effectively providing a 212X transistor when both are switched with 0 ns delay). Again, note the initial voltage ringing, similar to the ringing associated with a standard power supply. Further note the slightly faster rise due to the relatively larger gate drive provided by two gate drive signals, relative to one. As further shown in the bottom portion of the comparison, the waveform labeled split-transistor with delay was generated with a switching power supply having a switching element implemented with a split-transistor and a 5 ns delay in between switching the individual transistors of that split transistor (e.g., switch size 62X transistor, delay 5 ns, and then switch size 150X transistor). Note the substantial reduction in initial voltage ringing (e.g., from about 1.5 volts peak-to-peak to less than 0.3 volts peak-to-peak).

Figure 2A:
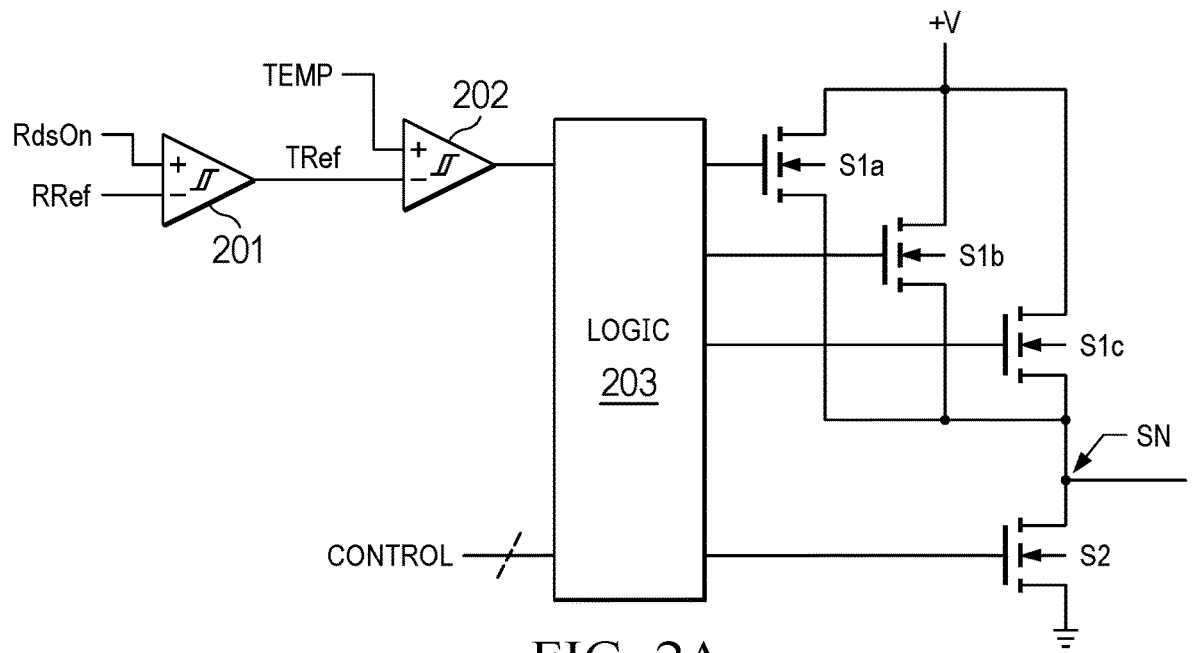
FIGS. 2A-B each illustrates a split-transistor switching power supply configured in another example.
Figure 2B:
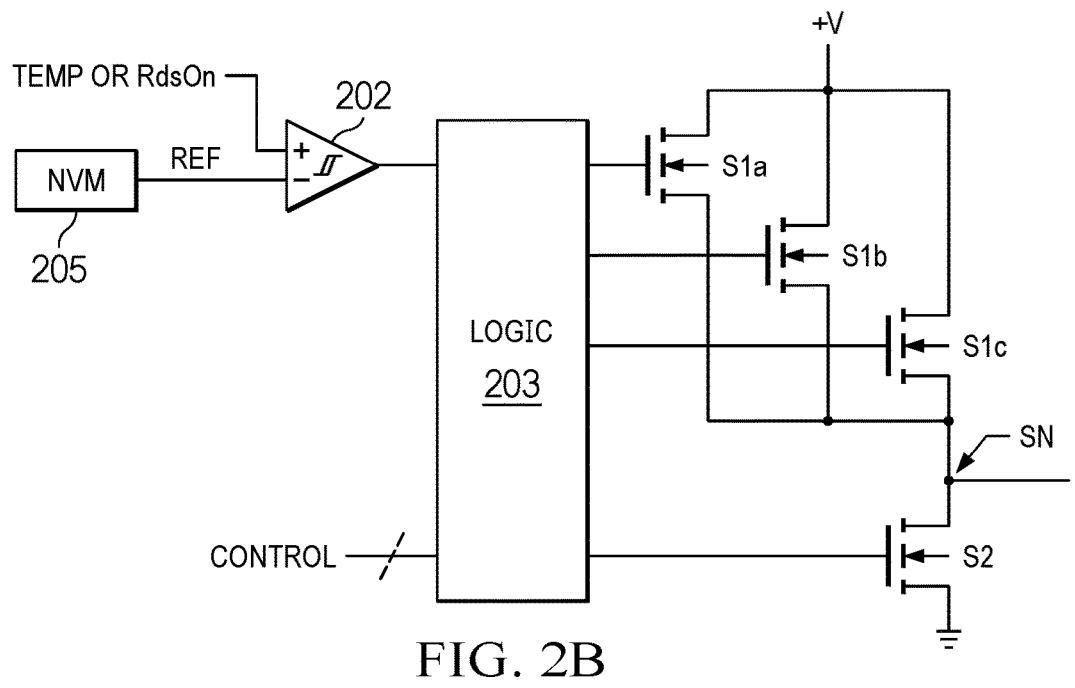

As described above, such a fixed ratio split-FET configuration works well in many applications, but can be limited because the first-switched FET S1a must be large enough to handle all of the current, not only under ideal conditions but also at worst-case temperature and worst-case process variation. For instance, increasing temperature may cause an increase in transistor on-resistance. Accordingly, another example allows the split-transistor ratio of the power supply to be adaptively and automatically selected from two or more choices based on temperature and/or process strength. FIGS. 2A and 2B each illustrates such an example.

As shown in FIG. 2A, the power supply includes a high-side/low-side switching configuration operatively coupled to a controller via a logic circuit 203. For example, the high-side switching element is implemented as a split-transistor that includes three parallel-connected FETs S1a, S1b, and S1c. The low-side switching element in this example is implemented with a single FET S2, and can be controlled as normally done. Recall that, as described above, the power supply may have any number of switching power supply topologies (e.g., buck, boost, buck-boost, flyback, half-bridge, and full-bridge). In this example, each of FETs S1a, S1b, S1c, and S2 receives a gate control signal from logic circuit 203, which is configured to delay delivery of one or more of those gate signals relative to one or more other of those gate signals, so as to provide two or more initial FET sizes (e.g., each initial size including one or more but not all of parallel-connected FETs S1a, S1b, and S1c) and then a final FET size (e.g., all of parallel-connected FETs S1a, S1b, and S1c) after the delay period. As further shown in FIG. 2A, comparators 201 and 202 are configured to assess the local conditions of process strength (on-resistance, RdsOn, in this example) and ambient temperature (temp), and inform logic circuit 203 as to the result of that assessment, thus allowing logic circuit 203 to select an appropriately sized initial FET. Such a configuration thus allows the split-transistor to have an adjustable ratio (transistor$_{final\_size}$: transistor$_{initial\_size}$), in that it provides two or more ratios that can be selected based on the assessment of temperature and process strength.

As described above, the power supply can be any type of switching power supply, including those that have only one switching element (e.g., FIG. 1C) rather than high-side and low-side switching elements (e.g., FIG. 1A), and that above description is equally applicable here. In one specific such example, the power supply is configured as a buck switching regulator. The application may vary, but one such example switching regulator may be, for instance, within a passenger vehicle and operatively coupled between an automotive battery and one or more loads to convert the battery voltage (e.g., 12 volts or 48 volts) to a lower voltage (e.g., 3.3 volts or 5 volts). The control input to logic circuit 203 has a dashed line through it, indicating that control input may include more than one control signal, such as high-side and low-side control signals, as is the case with the examples of FIGS. 2A and 2B. Such control signal(s) can be provided by any suitable controller, such as a standard PWM switching power supply controller that generates control signals based on feedback representative of an output voltage sensed at a switching node or output node.

FETs S1a, S1b, and S1c may all be the same size or differently sized. For instance, in one example, S1a and S1b may be the same size (e.g., 1X) and S1c may be larger (e.g., 2X). In another example, FET S1a is the smallest (e.g., 12X), FET S1b is mid-sized (e.g., 24X), and FET S1c is the largest (e.g., 64X). In any such cases, each of FETs S1a, S1b, and S1c has a larger on-resistance (RdsOn) as compared to the on-resistance of a single larger FET formed by the parallel combination of FETs S1a, S1b, and S1c. Because FETs S1a, S1b, and S1c can be individually controlled (gated or driven), different split-FET ratios can be achieved. For instance, and continuing with the S1a=12X; S1b=24X; and S1c=64X example, a first ratio of 100:12 (which reduces to 25:3) can be achieved by initially gating only FET S1a and then gating S1b and S1c after the delay period, such that the initial output slewing of the power supply is accomplished by FET S1a only, and full-conduction is subsequently accomplished by all FETs S1a, S1b, and S1c. A second ratio of 100:24 (which reduces to 25:6) can be achieved by initially gating only FET S1b and then gating S1a and S1c after the delay period, such that the initial output slewing of the power supply is accomplished by FET S1b only, and full-conduction is subsequently accomplished by all FETs S1a, S1b, and S1c. A third ratio of 100:36 (which reduces to 25:9) can be achieved by initially gating only FETs S1a and S1b and then gating S1c after the delay period, such that the initial output slewing of the power supply is accomplished by FET S1a and S1b only, and full-conduction is subsequently accomplished by all FETs S1a, S1b, and S1c. A fourth ratio of 100:64 (which reduces to 25:16) can be achieved by initially gating only FET S1c and then gating S1a and S1b after the delay period, such that the initial output slewing of the power supply is accomplished by FET S1c only, and full-conduction is subsequently accomplished by all FETs S1a, S1b, and S1c. Additional ratios may be achieved by initially gating only S1c and S1a, or S1c and S1b, and then gating all three after the delay period. In any such cases, the result may be that the ringing (at switching node SN) during the initial output slewing can be reduced by a relatively larger on-resistance RdsOn of the initially-gated FET(s).

As further shown in FIG. 2A, the logic circuit 203 includes a first logic circuit input, a second logic circuit input, a first logic circuit output, a second logic circuit output, a third logic circuit output, and a fourth logic circuit output. In more detail, the first logic circuit input of logic circuit 203 is configured to receive one or more control signals (e.g., PWM control signal from controller 101), and the second logic circuit input of logic circuit 203 is configured to receive a logic control signal from comparator 202. Also, each of the first, second, third and fourth logic circuit outputs is configured to provide a corresponding gate control signal to a gate of a corresponding one of FETs S1a, S1b, S1c and S2, respectively. The gate control signal applied to FET S2 can be based on the PWM signal. The gate control signals applied to FETs S1a, S1b, S1c can be based on both the PWM signal and the logic control signal.

In this example, the logic control signal provided by comparator 202 is based on both process strength associated with the switching element and ambient temperature associated with the power supply. In more detail, comparator 202 is configured to receive at its temperature signal input (non-inverting input in this example case) a signal representative of the ambient temperature (Temp), and to receive at its temperature reference signal input (inverting input in this example case) a temperature reference signal (TRef). So, if the magnitude of the Temp signal is larger than the TRef signal, the comparator 202 output is high; otherwise, the comparator 202 output is low. As further shown in the example of FIG. 2A, the TRef signal is provided by comparator 201. In more detail, comparator 201 is configured to receive at its process strength signal input (non-inverting input in this example case) a signal representative of the process strength (which in this example is RdsOn), and to receive at its process strength reference signal input (inverting input in this example case) a process strength reference signal (RRef). So, if the magnitude of the RdsOn signal is larger than the RRef signal, the comparator 201 output is high; otherwise, the comparator 201 output is low. In this manner, the TRef signal can be selected based on the process strength as indicated by RdsOn. Comparator 202 may be further configured with hysteresis, to prevent chatter.

So, in one such example case, if the Temp signal is higher than the TRef signal, then the output of comparator 202 is high. Responsive to that high signal from comparator 202, logic circuit 203 initially outputs gate control signals to both FETs S1a and S1b, and after a delay period outputs gate control signals to all FETs S1a, S1b, and S1c. In contrast, if the Temp signal is lower than the TRef signal, then the output of comparator 202 is low. Responsive to that low signal from comparator 202, logic circuit 203 initially outputs a gate control signal only to FET S1a, and after a delay period outputs gate control signals to all FETs S1a, S1b, and S1c. Other such examples may gate different ones or combinations of the available FETs S1a, S1b, and S1c. In any such cases, the split-FET ratio can be adapted based on temperature and process strength, and ringing at the switching node SN can be reduced.

FIG. 2B shows another example similar to that of FIG. 2A, except that there is no comparator 201 and the logic control signal provided by comparator 202 is based on one of process strength associated with the switching element or ambient temperature associated with the power supply. The above relevant description is equally applicable here, with respect to common features. As further shown in FIG. 2B, comparator 202 is configured to receive at its non-inverting input a signal representative of either the ambient temperature (Temp) or process strength (RdsOn, in this example case), and to receive at its inverting input a reference signal (Ref) provided from a non-volatile memory (NVM) 205. So, if the magnitude of the Temp or RdsOn signal is larger than the Ref signal, the comparator 202 output is high; otherwise, the comparator 202 output is low. Again, comparator 202 may be further configured with hysteresis, to prevent chatter. As described with reference to FIG. 2A, logic circuit 203 is responsive to the comparator 202 output signal, and accordingly adapts the split-FET ratio based on temperature or process strength, and reduces ringing at the switching node SN.

The non-volatile memory 205 from which data representing the Ref signal is provided can be, for example, a programmable/erasable read-only memory (ROM) or a look-up table that is populated with data representative of the desired temperature or process strength reference signal value for a given application. In some examples, data representative of one or both of the Temp signal and the RdsOn signal may also be stored in the memory, along with the reference signal data. For instance, RdsOn can be measured (in advance) for a given wafer lot or die using automatic test equipment (such as the example described with reference to FIG. 7) and stored into memory 205. In an example case, a process strength indicator such as RdsOn for a given 1X transistor on a given wafer or die tends to be the same (within a reasonable tolerance, such as +/−5% or +/−2% or +/−1%) across all the 1X transistors of that wafer or die, and is proportional to larger transistors (e.g., 2X, 3X, etc.). Such process strength indicators also tend not to change once set in the fabrication facility, in that they tend to maintain the same profile over temperature that is subsequently exhibited in the field (any use application) as compared to that profile exhibited in the fabrication or test facility. Likewise, the ambient temperature profile of a given application may be relatively consistent or otherwise predictable. In any such cases, it may be acceptable to store process strength and/or temperature data in memory 205, rather than measure the process strength and/or ambient temperature in the field within a given application. So, the Temp and RdsOn signal data may be measured live or stored in advance, according to some examples.

The reference values (e.g., RRef, Ref) can be tuned or set based on desired performance for given application. For instance, assume it is desired for a given application to achieve a balance between a sufficiently high RdsOn for a sufficiently low level of ringing, and a sufficiently large FET to carry full load current. The level of acceptable ringing can be set, for example, so that EMI meets a given specification and also so that voltage excursion does not exceed a given breakdown specification or otherwise cause damage. Also, the initially-gated switching device (e.g., one or more parallel-connected FETs but not all) can be sized to carry full load current so that the power supply is efficient. Thus, one way to select the RdsOn reference value is to set it to achieve the desired amount of ringing. As described above, ringing occurs due to stray inductance (L), stray capacitance (C), and FET resistance (R) giving an RLC resonant network. The damping factor of an RLC network is directly proportional to R, so raising R proportionately raises the damping factor. A circuit with a damping factor of 1 has no overshoot (referred to as critically damped). This can be used as one bound on the RdsOn reference value. Also, RdsOn can be selected so that the initially-gated FET can carry full load current. The on-resistance of a power FET (RdsOn) is related to the total current that the FET can carry with a specific gate voltage. This can be used as the other bound on the RdsOn reference value. The RdsOn reference value (RRef) can be set between these two bounds with a desired safety margin, according to some such examples.

Although, RdsOn is used in this example, other process strength indicators can be used as well. For instance, arbitrarily assume that RdsOn equals R and drive current maximum equals Id. Further assume that the split-transistor includes three parallel-connected FETs, as follows: S1a=1X, S1b=1X, and S1c=6X. So, initially gating only S1a yields an RdsOn of R/1 and a drive current 1*Id. Similarly, initially gating S1a and S1b yields an RdsOn of R/2 and a drive current 2*Id. In either of these cases, gating all three FETs after the delay period yields and RdsOn of R/8 and a drive current of 8*Id. Accordingly, maximum drive current Id can also be used as a process strength indicator, according to some examples.

Figure 3:
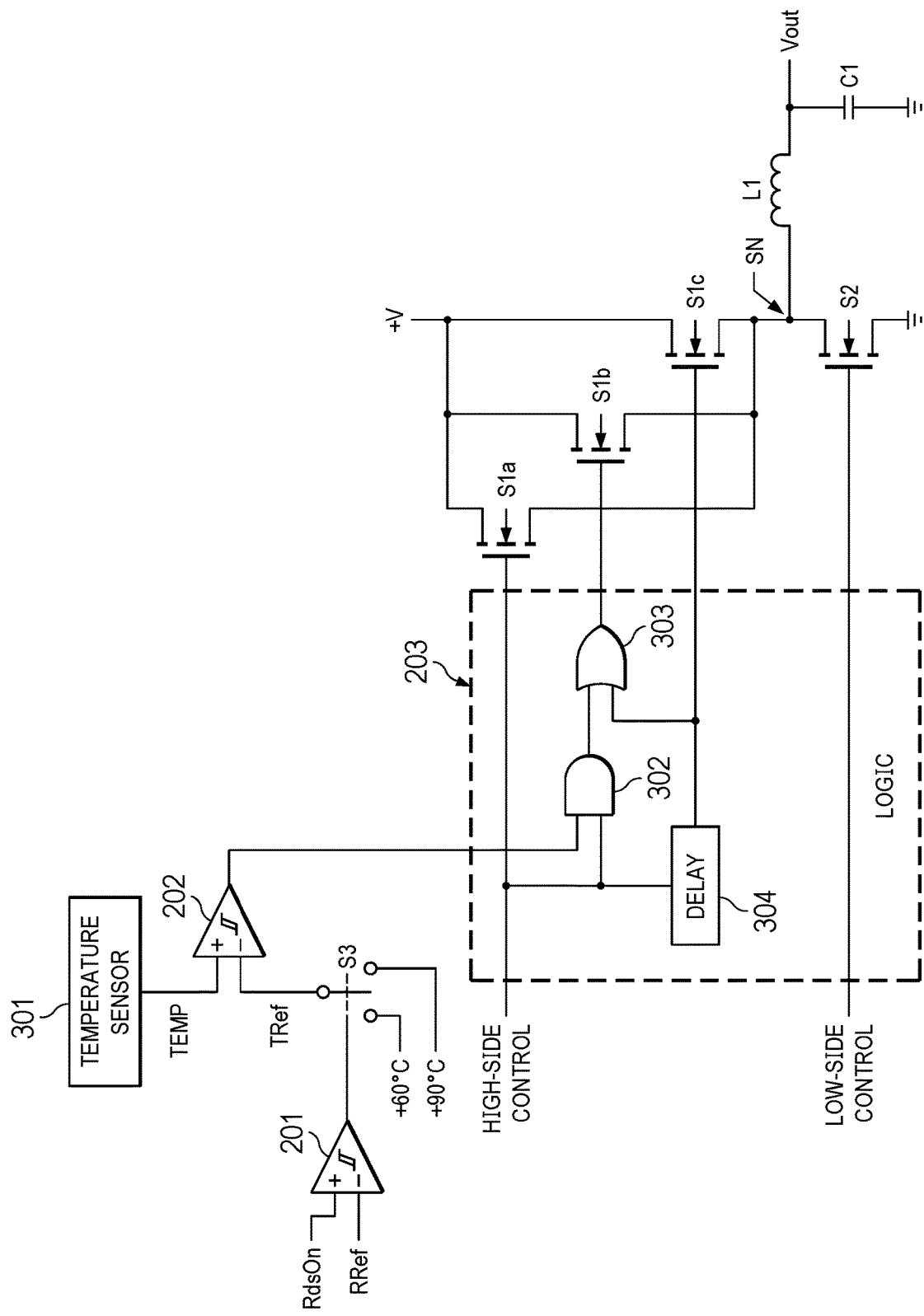
FIG. 3 is a schematic diagram of a split-transistor switching power supply configured in an example.

FIG. 3 is a schematic diagram of a split-transistor switching power supply that has some similar features to the supplies shown in FIGS. 1A, 1C, 2A, and 2C, but further includes details of logic circuit 203 and the comparator-based assessment circuitry, according to some examples. The above relevant description is equally applicable here, with respect to common features. Further recall that, although a high-side/low-side buck converter configuration is shown, any number of other switching power supply topologies can be used (e.g., buck, boost, buck-boost, flyback, half-bridge, and full-bridge). Accordingly, the techniques described herein can be readily applied to any split-transistor switching element of a given switching power supply topology, whether that switching element is a high-side switching element, a low-side switching element, a sole switching element, or some other switching element.

In this specific example, the non-inverting input of comparator 202 is coupled to a temperature sensor 301, which can be any number of temperature sensing circuits cable of providing a signal Temp that is representative of the ambient temperature. In some examples, there may be one or more additional circuits between sensor 301 and comparator 202 to facilitate interface of the sensor output signal to the input of comparator 202, such as buffer circuitry, filter circuitry, level-shifting circuitry, analog-to-digital (A/D) conversion circuitry, signal scaling (amplifier/attenuator) circuitry, and/or a look-up table that is indexed by sensor output signal values and outputs a corresponding Temp value. Also, the ambient temperature can be normalized into a desired unit, such as Celsius, Fahrenheit, or other temperature scale.

As further shown in FIG. 3, the TRef signal is adjustable by operation of switch S3 and is dependent on the process strength indicator RdsOn. In this particular example, RdsOn can be measured live or provided from a memory and is compared to the RRef signal. If RdsOn is greater than RRef, then comparator 201 outputs a high signal which in turn switches S3 to the 90° C. position, thereby setting the TRef signal to 90° C. In contrast, if RdsOn is less than RRef, then comparator 201 outputs a low signal which in turn switches S3 to the 60° C. position, thereby setting the TRef signal to 60° C. In other examples, switch S3 can be implemented with a look-up table that is indexed by possible output signal values from comparator 201, and that outputs TRef value that corresponds to the received output signal value.

As further shown in FIG. 3, if the Temp signal derived from sensor 301 is higher than the selected TRef signal, then the output of comparator 202 is high. In contrast, if the Temp signal derived from sensor 301 is lower than the selected TRef signal, then the output of comparator 202 is low. This output signal of comparator 202 is a logic control signal to logic circuit 203.

Logic circuit 203 can be implemented with a number of logic schemes. The example shown in FIG. 3 includes a delay circuit 304, an AND-gate 302, and an OR-gate 303. The delay circuit 304 is configured to receive the high-side control signal and output a delayed version of that control signal. The control signal can be, for example, a PWM control signal generated by controller 100. The delay circuit 304 may be, for example, similar to the delay circuit 101 described above with reference to FIGS. 1A and 1C, and that relevant description is equally applicable here. The AND-gate 302 is configured to receive as inputs the control signal (high-side PWM control signal in this example case) and the logic control signal from comparator 202. The output of AND-gate 302 will only be high if both the PWM control signal and the logic control signal are high; otherwise, the output of AND-gate 302 is low. The OR-gate 303 is configured to receive as inputs the output signal of AND-gate 302 and the delayed version of the PWM control signal. The output of OR-gate 303 is high if either or both of the delayed PWM control signal and the output of AND-gate 302 are high; otherwise, if both inputs to OR-gate 303 are low, the output of OR-gate 303 is low.

So, in operation, if the temperature Temp signal is greater than the selected TRef signal, then comparator 202 outputs a high signal. If, during that time, the high-side control signal is also high, then the AND-gate 302 outputs a high signal which in turn causes the OR-gate 303 to output a high signal. Thus, FETs S1a and S1b are initially gated and S1c remains off for the delay period provided by delay circuit 304. After the delay period (e.g., 5-15 ns), FET S1c is also gated, so that all three FETs S1a-c are active. In contrast, if the Temp signal is less than the selected TRef signal, then comparator 202 outputs a low signal. If, during that time, the high-side control signal is also high, then the AND-gate 302 outputs a low signal which in turn causes the OR-gate 303 to initially output a low signal. Thus, only FET is initially gated and FETs S1b and S1c remain off for the delay period. After the delay period, FETs S1b and S1c are also gated, so that all three FETs S1a-c are active.

In an example, at least a portion of logic circuit 203 may be included in an integrated circuit chip. In one such example case, the high-side control signal passes directly through that integrated circuit chip to the gate of FET S1a. In another such example, the high-side control signal may be directly applied to the gate of FET S1a, without passing through the integrated circuit chip. Such deviations are considered equivalents in this description. So, for example, in some cases a portion of logic circuit 203 is included in an integrated circuit chip that includes a first input to receive the PWM control signal input (high-side, in this example), a second input to receive the logic control signal, a first output to provide the output of OR-gate 303, and a second output to provide the delayed version of the PWM control signal. In such a case, the gate drive signal provided to FET S1a may or may not pass through the integrated circuit chip. In either case, that gate drive signal can be considered to be an output of the logic circuit 203. The same principle may apply to a low-side PWM control signal, or any other control signal. Likewise, the delay circuit 304 may be provided outside of the integrated circuit, but may still be considered to be part of the logic circuit 203.

Figure 4:
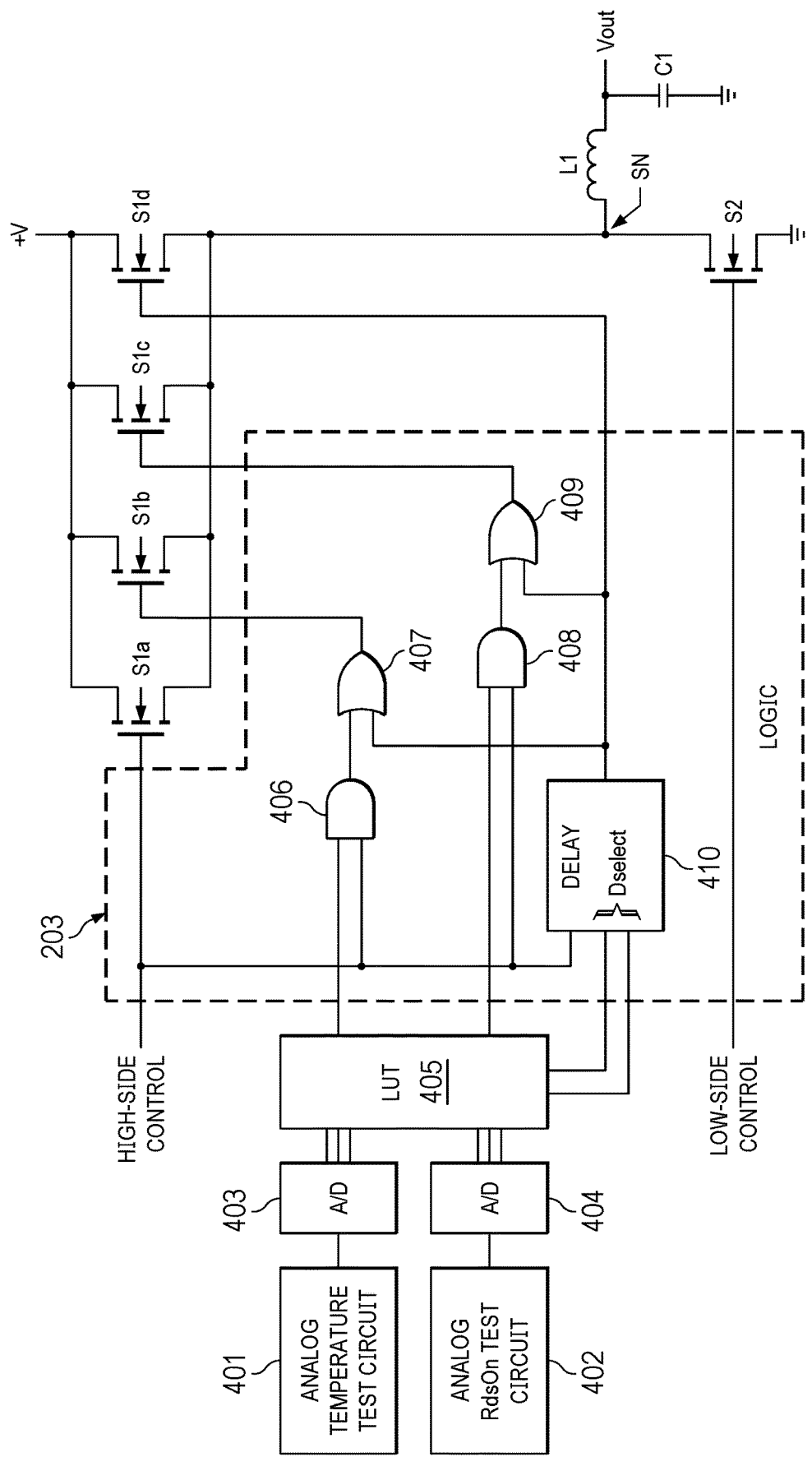
FIG. 4 is a schematic diagram of a split-transistor switching power supply configured in another example.

FIG. 4 is a schematic diagram of a split-transistor switching power supply that has some similar features to the supplies shown in FIGS. 1A, 1C, 2A, 2C, and 3, with some notable distinctions. For example, the split-FET switching element includes four parallel-connected FETs (S1a, S1b, S1c, and S1d) instead of three (S1a, S1b, and S1c), thus increasing the split-FET ratios available for selection responsive to temperature and/or process strength indications. Also, the circuitry configured to assess the temperature and/or process strength indications as well as the logic circuit 203 are configured to facilitate that increased selection process. The above relevant description is equally applicable here, with respect to common features. Further recall that any number of other switching power supply topologies can be used.

In this specific example, the comparator or assessment circuitry is implemented with analog temperature test circuit 401, analog RdsOn test circuit 402, analog-to-digital (A/D) converters 403 and 404, and a look-up table (LUT) 405. The A/D converter 403 receives an analog signal representative of the ambient temperature from measurement circuit 401, and generates a 3-bit digital equivalent of that analog signal. Similarly, the A/D converter 404 receives an analog signal representative of the process strength (in this case, RdsOn) from measurement circuit 402, and generates a 3-bit digital equivalent of that analog signal. The LUT 405 receives as input 3-bit outputs from each of the A/D converters 403 and 404, and outputs a corresponding set of logic control signals that includes four signals in this example. Such an arrangement allows for greater resolution in the split-transistor ratio selection process for the switching element. Also, in this example configuration, the delay period is configurable or otherwise adjustable based on a 2-bit select code output by LUT 405.

Figure 7:
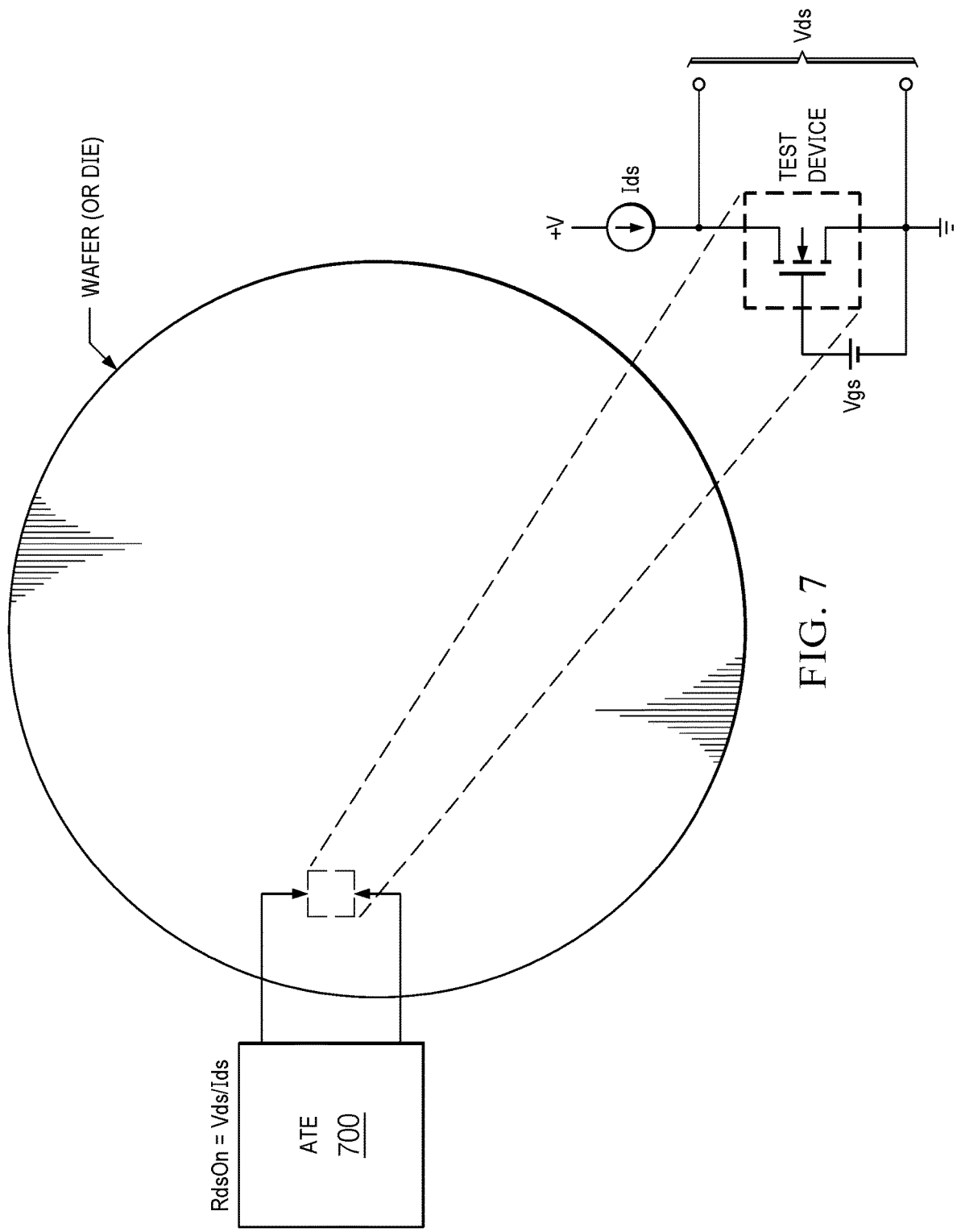
FIG. 7 illustrates an example process for measuring process strength of a transistor, in an example.

The analog temperature test circuit 401 can be any suitable circuit for indicating ambient temperature (e.g., similar to sensor 301). The analog RdsOn test circuit 402 can include, for instance, any one of the 1X FETs included on the die on which the switching elements are formed and that is dedicated for RdsOn (or drive current) assessment. The transistor can have a known drive signal applied to its gate, a known current source (Ids) applied to its drain, and its source can be connected to ground. With the gate drive signal applied and the current source on, the voltage across the source and drain (Vds) of the transistor can be measured. With Vds and Ids known, RdsOn can be computed (Vds/Ids). One such example test circuit is shown in FIG. 7. The resulting analog signals representative of the ambient temperature and the process strength (RdsOn in this example) are then converted to digital signals, which are 3-bits each in this example (other examples may have fewer bits or more bits). The A/D converters 403 and 404 can be implemented with standard or proprietary technology.

The LUT 405 receives the two 3-bit signals and generates an output that corresponds to that 6-bit input. At a high-level, in some examples, if the 3-bits from the A/D converter 403 are 000, then temperature can be ignored and the split-FET ratio can be selected based solely on process strength; likewise, if the 3-bits from the A/D converter 404 are 000, then RdsOn can be ignored and the split-FET ratio can be selected based solely on temperature. In still other examples, both temperature and RdsOn can be simultaneously taken into consideration to determine the split-FET ratio. The LUT 405 outputs a set of logic control signals (four logic control signals, in this example case) to logic circuit 203.

Again, the configuration of logic circuit 203 can vary from one example to the next, but in this example includes AND-gates 406, 408, OR-gates 407, 409, and delay circuit 410. In more detail, the AND-gate 406 is configured to receive as inputs the high-side PWM control signal (in this example case) and one of the four logic control signals from LUT 405. The output of AND-gate 406 will only be high if both the PWM control signal and the logic control signal are high; otherwise, the output of AND-gate 406 is low. The OR-gate 407 is configured to receive as inputs the output signal of AND-gate 406 and the delayed version of the PWM control signal. The output of OR-gate 407 is connected to the gate of FET S1b and is high if either or both of the delayed PWM control signal and the output of AND-gate 406 are high; otherwise, if both inputs to OR-gate 407 are low, the output of OR-gate 407 is low. Similarly, the AND-gate 408 is configured to receive as inputs the high-side PWM control signal and another one of the four logic control signals from LUT 405. The OR-gate 409 is configured to receive as inputs the output signal of AND-gate 408 and the delayed version of the PWM control signal. The output of OR-gate 409 is connected to the gate of FET S1c and is high if either or both of the delayed PWM control signal and the output of AND-gate 408 are high; otherwise, if both inputs to OR-gate 409 are low, the output of OR-gate 409 is low. Delay circuit 410 is configured to receive the other two of the four logic control signals from LUT 405, at its delay select input (Dselect). The delay circuit 410 can be implemented, for instance, as individual edge delay circuits, each configured to provide a fixed delay and that are enabled (or disabled) based on the 2-bit select code received from LUT 405. Alternatively, delay circuit 410 can be implemented as an edge delay circuit that has a variable delay based on the 2-bit select code received from LUT 405. At a high-level, in some examples, if the 2-bit logic control signal applied to the Dselect input of delay circuit 410 is 00, then a fixed or default delay period can be used. As further shown in FIG. 4, the PWM control signal passes through logic circuit 203 to the gate of S1a (with no delay or intervening logic).

So, in operation, if AND-gate 406 outputs a high signal which in turn causes the OR-gate 407 to output a high signal, then at least FETs S1a and S1b are initially gated. After the delay period (e.g., 5-15 ns), FETs S1c (if not already gated) and S1d are also gated so that all four FETs S1a-d are active. In contrast, if the AND-gate 406 outputs a low signal which in turn causes OR-gate 407 to initially output a low signal, then FET S1a is initially gated without S1b being gated. After the delay period, FETs S1c (if not already gated) along with FETs S1b and S1d are also gated so that all four FETs S1a-d are active. Likewise, if AND-gate 408 outputs a high signal which in turn causes the OR-gate 409 to output a high signal, then at least FETs S1a and S1c are initially gated.

After the delay period, FETs S1b (if not already gated) and S1d are also gated so that all four FETs S1a-d are active. In contrast, if the AND-gate 408 outputs a low signal which in turn causes OR-gate 409 to initially output a low signal, then FET S1a is initially gated without S1c being gated. After the delay period, FETs S1b (if not already gated) along with FETs S1c and S1d are also gated so that all four FETs S1a-d are active.

Table 1 below shows an example LUT 405 that is indexed by the 3-bit inputs from the A/D converters 403 and 404, and outputs a set of four control logic signals: one applied to AND-gate 406; one applied to AND-gate 408, and the other two form a 2-bit delay period select signal applied to the Dselect input of delay circuit 410. Note the increased granularity of options on which the split-FET ratio can be set. Specifically, the two least significant bits of the 3-bit input from A/D converter 403 are used to indicate the temperature condition, and the most significant bit is used as one bit of a 2-bit delay indicator. Similarly, the two least significant bits of the 3-bit input from A/D converter 404 are used to indicate the process strength condition, and the most significant bit is used as the other bit of the 2-bit delay indicator. So, in this example, there are four possible process strength conditions (PS1, PS2, PS3, and PS4), four possible temperature conditions (T1, T2, T3, and T4), and four possible delay conditions (D1, D2, D3, and D4). Any of these conditions can be considered in a singular fashion in which the other conditions are ignored or set to a default value, or can be considered in a Boolean fashion in which one or more of the other conditions are also simultaneously considered. Numerous permutations are possible to provide a set of two or more options for the split-FET ratio of a given switching element, according to this description.

TABLE 1

Example LUT for generating gate control signals and delay control signals

| Input Index | | Output | | | |
|---|---|---|---|---|---|
| Temp (from A/D 403) | Process Strength (from A/D 404) | Initial S1b Gate Control Signal (to AND-gate 406) | Initial S1c Gate Control Signal (to AND-gate 408) | Delay Period Select | Conditions on which Split-FET ratio is based |
| 000 | 000 | 0 | 0 | 00 | PS1/T1/D1 |
| 000 | 001 | 1 | 0 | 00 | PS2/T1/D1 |
| 000 | 010 | 0 | 1 | 00 | PS3/T1/D1 |
| 000 | 011 | 1 | 1 | 00 | PS4/T1/D1 |
| 000 | 100 | 0 | 0 | 01 | PS1/T1/D2 |
| 000 | 101 | 1 | 0 | 01 | PS2/T1/D2 |
| 000 | 110 | 0 | 1 | 01 | PS3/T1/D2 |
| 000 | 111 | 1 | 1 | 01 | PS4/T1/D2 |
| 001 | 000 | 0 | 0 | 00 | PS1/T2/D1 |
| 001 | 001 | 1 | 0 | 00 | PS2/T2/D1 |
| 001 | 010 | 0 | 1 | 00 | PS3/T2/D1 |
| 001 | 011 | 1 | 1 | 00 | PS4/T2/D1 |
| 010 | 000 | 0 | 0 | 00 | PS1/T3/D1 |
| 010 | 001 | 1 | 0 | 00 | PS2/T3/D1 |
| 010 | 010 | 0 | 1 | 00 | PS3/T3/D1 |
| 010 | 011 | 1 | 1 | 00 | PS4/T3/D1 |
| 011 | 000 | 0 | 0 | 00 | PS1/T4/D1 |
| 011 | 001 | 1 | 0 | 00 | PS2/T4/D1 |

TABLE 1-continued

Example LUT for generating gate control signals and delay control signals

| Input Index | | Output | | | Conditions on which Split-FET ratio is based |
|---|---|---|---|---|---|
| Temp (from A/D 403) | Process Strength (from A/D 404) | Initial S1b Gate Control Signal (to AND-gate 406) | Initial S1c Gate Control Signal (to AND-gate 408) | Delay Period Select | |
| 011 | 010 | 0 | 1 | 00 | PS3/T4/D1 |
| 011 | 011 | 1 | 1 | 00 | PS4/T4/D1 |
| ... | ... | ... | ... | ... | ... |
| 100 | 011 | 1 | 1 | 10 | PS4/T1/D3 |
| ... | ... | ... | ... | ... | ... |
| 110 | 011 | 1 | 1 | 10 | PS4/T3/D3 |
| ... | ... | ... | ... | ... | ... |
| 111 | 111 | 1 | 1 | 11 | PS4/T4/D4 |

Although this example of FIG. 4 and Table 1 has four parallel-connected transistors making up the split-FET switching element, with one FET (S1a) that is directly-gated by the PWM control signal, one FET (S1d) that is directly-gated by the delayed PWM control signal, and two FETs (S1b and S1c) that can each be selectively-gated (or not) to provide up to four different split-FET ratios in conjunction with S1a and S1d, other examples may have fewer parallel-connected FETs or more parallel-connected FETs. For instance, another example is similar to that shown in FIG. 4, but without FET S1a. Another example is similar to that shown in FIG. 4, but without FET S1a or S1d, and in which S1b or S1c are differently-sized and either one can be initially-gated and the other one is delay-gated, thus providing two possible split-FET ratios (ratio #1=S1b+S1c:S1b, and ratio #2=S1b+S1c:S1c). Likewise, logic circuit 203 is shown here with two gate control signal outputs (from OR-gates 407 and 409, respectively) that can vary depending on temperature and/or process strength, but other examples may have fewer such gate control signals (e.g., FIG. 3) or more of such gate control signals. In the latter case, for instance, logic circuit 203 may include one or more additional AND-gate/OR-gate pairs similar to those shown in FIG. 4 to selectively (adaptively) drive one or more corresponding additional parallel-connected FETs of the switching element being controlled. In such a case, the number of logic control signals generated by the assessment circuitry can be increased to support those additional pairs (gate driver channels) of logic circuit 203. For instance, in the example of FIG. 4, the A/D converters 403 and 404 may have 4-bit outputs instead of 3-bit outputs, thereby increasing the number of logic control signal entries populated into LUT 405. Likewise, in the example of FIG. 3, the output of comparator 202 may be one of a plurality of comparator outputs, with each additional comparator to detect a specific range of temperature and/or process strength.

The examples depicted in FIGS. 2A-4 adapt the split-transistor ratio based on temperature and/or process strength. However, as described above, other conditions may be used to inform the adaptation of the split-transistor ratio in addition to, or alternatively to, temperature and/or process strength. Other example conditions that are local to the power supply and can be sensed or otherwise known for a given application include ringing amplitude, input voltage, load current, and/or switching speed. Such conditions are not necessarily mutually exclusive and each one may be a valid indicator of a similar impact on power supply performance. In this manner, the various conditions may overlap in their ability to indicate a performance issue.

For instance, and with respect to power supply input voltage provided at the supply node (e.g., +V), a given goal for a given application may be to reduce absolute voltage peak to avoid damage. Damage could occur, for instance, if the voltage peak exceeds the absolute maximum rating of a component in the power supply, such as the breakdown voltage of a switching element. So, in a similar manner to sensing temperature, the power supply input voltage can be sensed and that sensed value can be used as an input to a look-up table or compared to a reference value, and the resulting output signal(s) can be used, directly or indirectly, to generate gate control signal(s). Thus, the initial FET size can be selected, at least in part, based on a function of inputs (e.g., initial size of split-FET=function (Temp, RdsOn, and/or Vin)).

In another example, the voltage excursion from ringing may tend to be higher if the power supply is operating at a higher load current. In some applications, it may therefore be helpful to use a different initial FET size at higher currents. For example, high load current may benefit from an initially larger FETs. So, in a similar manner to sensing temperature, the load current (Iload) can be sensed and that sensed value can be used as an input to a look-up table or compared to a reference value, and the resulting output signal(s) can be used, directly or indirectly, to generate gate control signal(s). Thus, the initial FET size can be selected, at least in part, based on a function of inputs (e.g., initial size of split-FET=function (Temp, RdsOn, Iload, and/or Vin)).

In another example, the switching speed of a given switching element may be assessed and used to inform the split-transistor ratio adaptation. In more detail, many things may cause variation in switching speed of power systems, including differences in stray capacitance and differences in silicon (or other semiconductor process) manufacturing parameters such as gate oxide thickness. If the power supply switches faster, then the rate of current change with respect to time (dI/dt) will be different. By measuring switching speed and using this in conjunction with other parameters in the determination of initial FET size, the initial FET size can be tuned for a desired amount of ringing. Thus, the initial FET size can be selected, at least in part, based on a function of inputs (e.g., initial size of split-FET=function (switching speed, and one or more other conditions). For example, in this function, temperature may or may not be included, because switching speed may include some temperature effects (overlap of conditions). In some such examples, measuring switching speed is accomplished as shown in the example depicted in FIG. 5, which is similar to that shown in FIG. 2A, except that this example further includes a comparator 501 and timer 502 which are used to determine switching speed, and the result of that determination is provided to comparator 202 to inform the split-FET ratio selection (process strength and/or other conditions may also be sensed and used in the split-FET ratio selection). The above relevant description is equally applicable here, with respect to common features.

Figure 5:
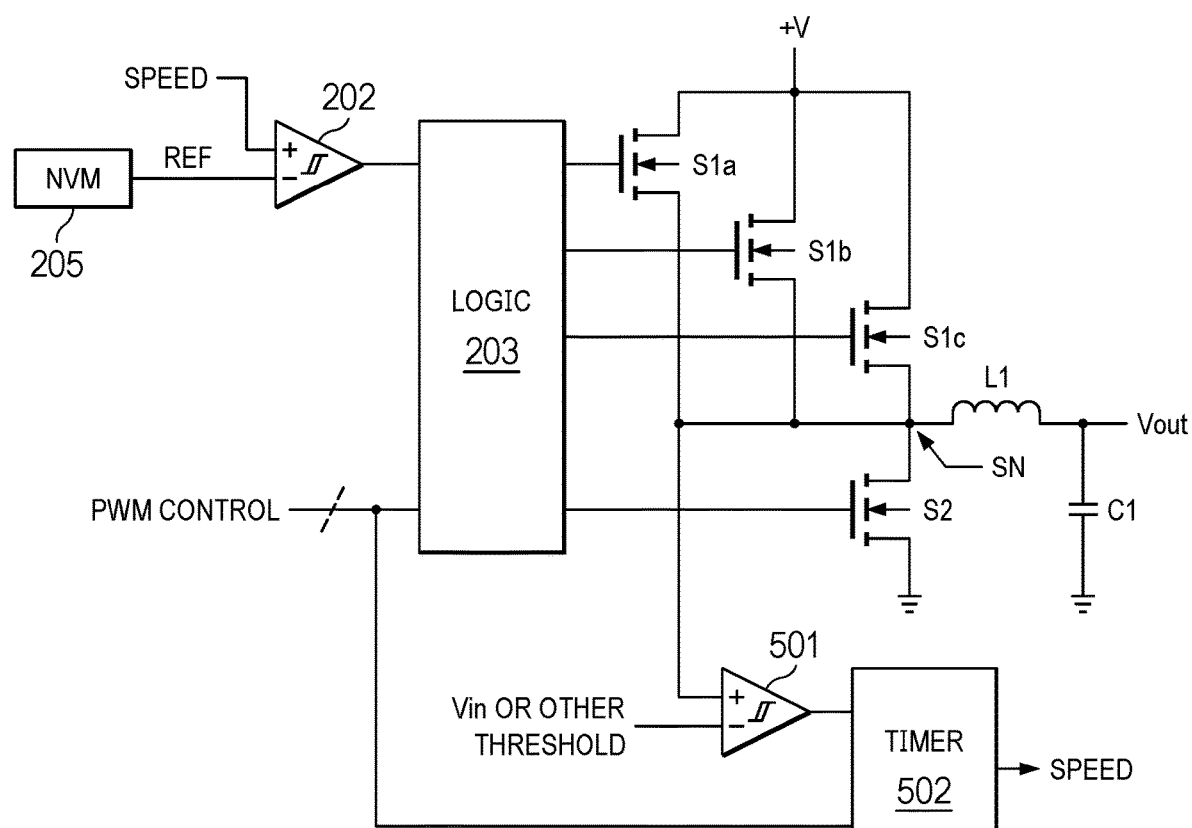
FIG. 5 is a schematic diagram of a split-transistor switching power supply configured in another example.

As shown in FIG. 5, a timer 502 is started after the PWM controller initially commands a FET to turn on. Comparator 501 detects when the voltage on the switching node SN reaches some threshold, such as Vin, and commands timer 502 to stop. The elapsed time is directly related to switching speed (dV/dt). Speed can be determined from a switching cycle of the actual power system (live, as shown here), but can also be measured on a scale replica of the switching system or other speed measurement circuit, built only for the purpose of indicating speed. In some examples, a ring oscillator can be used as a low-cost method to indicate speed.

Figure 6:
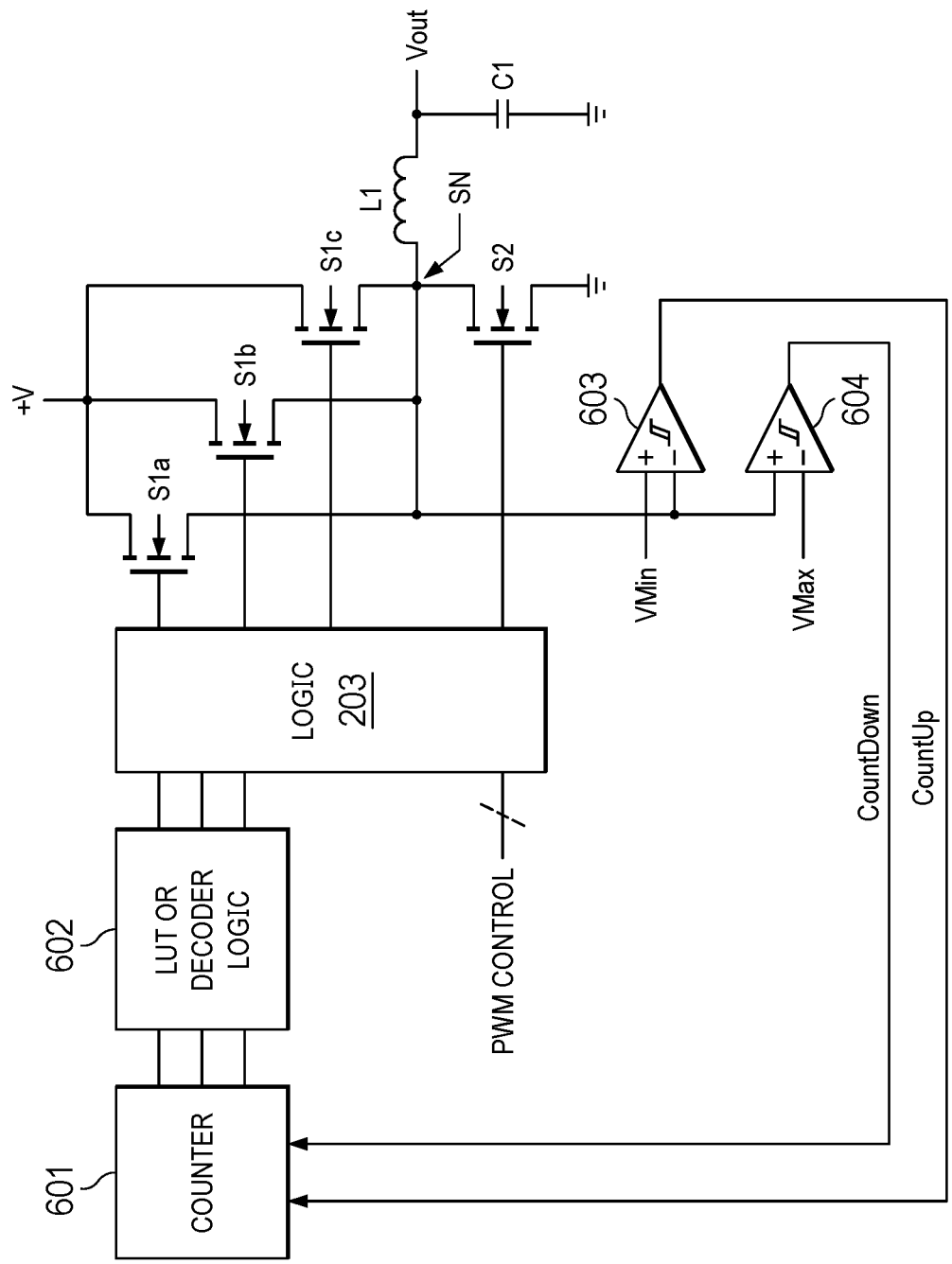
FIG. 6 is a schematic diagram of a split-transistor switching power supply configured in another example.

A different approach to solving the same problem is to measure the voltage excursion (also referred to as ringing amplitude, or ringing peak voltage, or Vpk) during a switching event. If Vpk is greater than desired, a smaller FET can be used for the initial switching; in contrast, if Vpk is lower than desired, a larger FET can be used for the initial switching. One such example is shown in FIG. 6, which is similar to that shown in FIG. 2A, except that this example further includes a peak sensor implemented with comparators 603 and 604, an up/down counter 601, and a look-up table or decoder logic 602 to translate the output of counter 601 to control signals for logic 203 (or for direct application to gates). Instead of immediately determining the initial size of the split-FET, this approach adapts to the right FET size after a few PWM switching cycles. In more detail, if comparator 604 senses that the peak is higher than VMax, it causes counter 601 to count down. The output of counter 601 causes a different size FET to be used for the next switching cycle initial surge. Similarly, if comparator 603 senses that the peak is lower than VMin, the counter 601 counts up. In this fashion, the system finds the initial split-FET size to give a desired amount of ringing. It may take a few switching cycles for the system to find a correct initial FET size. For safety, the system could start with counter 601 in the lowest setting (e.g., least ringing, lowest efficiency) and gradually increase initial FET size for higher efficiency until the desired amount of overshoot is achieved. Following this initial stabilization, the system would be able to track any changes by stepping up or down the counter 601 setting once per PWM switching cycle responsive to too much or too little overshoot.

FIG. 7 illustrates an example process for measuring process strength of a transistor, in an example. As shown, automatic test equipment (ATE) 700 is configured to deliver stimulus to a given transistor that is representative of the devices making up the split-FET switching element, and to compute RdsOn for that transistor. The transistor being tested may be, for example, on a wafer or a die that includes the power supply having the split-FET switching element. In an example, the transistor is biased in the linear region by applying a fixed voltage signal to the gate of the transistor so as to provide a fixed gate-to-source voltage, Vgs (e.g., 1 volt) and by applying a fixed current source to provide a fixed drain-source current, Ids (e.g., 10 mA). The resulting drain-to-source voltage (Vds) can be measured and compared to a reference (e.g., 0.1 volt). If Vds is greater than the reference, the process strength is weak; if Vds is less than the reference, the process strength is strong. RdsOn can also be computed by: Vds/Ids. Note in this example that ATE 700 is implemented external to the wafer or die. In some other examples, ATE 700 may be implemented on the wafer or die, so as to allow for in-field testing. In any such cases, the transistor to be tested can effectively be made available via contact pads or input/output I/O) pins or pads to which stimulus (e.g., Vgs, Ids) can be applied, and from which output (e.g., Vds) can be detected. An ATE or on-die processor can be provisioned to facilitate any computations (e.g., Vds/Ids). The computed process strength indicator (RdsOn, in this example case) can then be stored in NVM or represented as a live input signal as variously described above.

FURTHER EXAMPLES

Example 1 is a switching power supply that includes a switching element and a logic circuit. The switching element has two or more parallel-coupled transistors. The logic circuit has a first logic circuit input, a second logic circuit input, and a logic circuit output. The logic circuit is configured to: (a) receive at the first logic circuit input a pulse width modulation (PWM) signal, (b) receive at the second logic circuit input a logic control signal that is based on one or more conditions associated with the power supply, and (c) provide from the logic circuit output to a gate of one of the two or more parallel-coupled transistors a gate control signal that is based on both the PWM signal and the logic control signal.

Example 2 includes the switching power supply of Example 1, wherein the logic circuit output is a first logic circuit output and the gate control signal is a first gate control signal, and the logic circuit comprises a second logic circuit output, the logic circuit configured to provide from the second logic circuit output to a gate of a second of the two or more parallel-coupled transistors a second gate control signal that is based only on a delayed version of the PWM signal.

Example 3 includes the switching power supply of Example 2, and further includes a delay circuit configured to receive the PWM signal and output the delayed version of the PWM signal.

Example 4 includes the switching power supply of Example 2 or 3, wherein the logic circuit comprises a third logic circuit output, the logic circuit configured to provide from the third logic circuit output to a gate of a third of the two or more parallel-coupled transistors a third gate control signal that is based only on the PWM signal.

Example 5 includes the switching power supply of any one of Examples 1 through 4, wherein the logic circuit output is a first logic circuit output, the gate control signal is a first gate control signal and the logic control signal is a first logic control signal, and the logic circuit comprises a second logic circuit output, the logic circuit configured to provide from the second logic circuit output to a gate of a second of the two or more parallel-coupled transistors a second gate control signal that is based on the PWM signal and a second logic control signal, the second logic control signal being based on the one or more conditions.

Example 6 includes the switching power supply of any one of Examples 1 through 5, wherein the logic circuit output is a first logic circuit output, the gate control signal is a first gate control signal, the logic control signal is a first logic control signal, and the switching element comprise three or more parallel-coupled transistors, and the logic circuit comprises a second logic circuit output, the logic circuit configured to provide from the second logic circuit output to a gate of a second of the three or more parallel-coupled transistors a second gate control signal that is based on the PWM signal and a second logic control signal, the second logic control signal being based on the one or more conditions.

Example 7 includes the switching power supply of any one of Examples 1 through 4, and further includes a comparator circuit configured to generate the logic control signal based on the one or more conditions.

Example 8 includes the switching power supply of Example 7, wherein the one or more conditions include process strength associated with the switching element and ambient temperature associated with the power supply, and the comparator circuit is configured to generate the logic control signal based on both the ambient temperature and the process strength.

Example 9 includes the switching power supply of Example 8, wherein the comparator circuit comprises: a first comparator having a temperature signal input, a temperature reference signal input, and a first comparator output, the first comparator configured to (a) receive at the temperature signal input a signal representative of the ambient temperature, (b) receive at the temperature reference signal input a temperature reference signal, and (c) provide from the first comparator output the logic control signal; and a second comparator having a process strength signal input, a process strength reference signal input, and a second comparator output, the second comparator configured to (a) receive at the process strength signal input a signal representative of the process strength, (b) receive at the process strength reference signal input a process strength reference signal, and (c) provide from the second comparator output the temperature reference signal or a control signal by which the temperature reference signal is selected or otherwise based.

Example 10 includes the switching power supply of any one of Examples 7 through 9, wherein the comparator circuit comprises: a comparator having a first comparator input, a second comparator input, and a comparator output, the comparator configured to (a) receive at the first comparator input a signal representative of the one or more conditions, (b) receive at the second comparator input a reference signal, and (c) provide from the comparator output the logic control signal or another signal by which the logic control signal is selected or otherwise based.

Example 11 includes the switching power supply of Example 10, wherein the reference signal is provided from a non-volatile memory. In one such example, the second comparator input is coupled to a memory circuit.

Example 12 includes the switching power supply of any one of Examples 7 through 11, wherein the one or more conditions include process strength associated with the switching element and ambient temperature associated with the power supply, and the comparator circuit comprises: one or more analog-to-digital (A/D) converters including an A/D converter configured to receive as input an analog signal representative of the ambient temperature and/or an A/D converter configured to receive as input an analog signal representative of the process strength; and a look-up table configured to (a) receive as input one or more digital outputs from the one or more A/D converters, and (b) output one or more logic control signals, the one or more logic control signals including the logic control signal that is based on one or both of the process strength and the ambient temperature.

Example 13 includes the switching power supply of any one of Examples 1 through 12, wherein the one or more conditions include process strength associated with the switching element and ambient temperature associated with the power supply, and the switching power supply comprises: a temperature sensor circuit configured to provide a signal representative of the ambient temperature; and/or a process strength sensor circuit configured to provide a signal representative of the process strength.

Example 14 includes the switching power supply of any one of Examples 1 through 13, wherein the logic circuit comprises: a delay circuit configured to receive the PWM signal and output a delayed version of the PWM signal; an AND-gate configured to receive as inputs the PWM signal and the logic control signal, and output an AND-gate output signal; and an OR-gate configured to receive as inputs the AND-gate output signal and the delayed version of the PWM signal, and output the gate control signal.

Example 15 includes the switching power supply of any one of Examples 1 through 16, wherein the logic circuit is included in an integrated circuit chip that includes at least the first logic circuit input, the second logic circuit input, and the logic circuit output.

Example 16 includes the switching power supply of Example 15, wherein the one or more conditions include process strength associated with the switching element and ambient temperature associated with the power supply, and the integrated circuit chip comprises a comparator circuit configured to generate the logic control signal based on one or both of the ambient temperature and the process strength.

Example 17 includes the switching power supply of any one of Examples 1 through 16, wherein the switching element is one of: a high-side switching element coupled to a voltage supply terminal; or a low-side switching element coupled to a voltage reference terminal.

Example 18 includes the switching power supply of any one of Examples 1 through 17, wherein the one or more conditions includes process strength associated with the switching element, and the process strength is represented by an on-resistance of the switching element.

Example 19 includes the switching power supply of any one of Examples 1 through 18, wherein the one or more conditions includes one or more of: process strength associated with the switching element, ambient temperature associated with the power supply, ringing amplitude associated with the power supply, input voltage associated with the power supply, load current associated with the power supply, and/or switching speed associated with the power supply.

Example 20 includes the switching power supply of any one of Examples 1 through 19, wherein the one or more conditions includes one or both of process strength associated with the switching element and ambient temperature associated with the power supply.

Example 21 is a buck switching regulator comprising the switching power supply of any one of Examples 1 through 20. Other switching power supply topologies can be used as well, such as buck, boost, buck-boost, flyback, half-bridge, or full-bridge.

Example 22 is a switching power supply, comprising a switching element and a logic circuit. The switching element has a plurality of parallel-coupled transistors. The logic circuit is configured to (a) initially provide one or more gate drive signals to one or more of the parallel-coupled transistors, respectively, but not to all of the parallel-coupled transistors, and (b) after a delay period provide a respective gate drive signal to each of the parallel-coupled transistors, the initially-provided one or more gate signals being based on one or both of drain-to-source on-resistance (RdsOn) associated with the switching element and ambient temperature associated with the power supply.

Example 23 includes the switching power supply of Example 22, wherein responsive to the ambient temperature being higher than a temperature threshold and/or the RdsOn being higher than an on-resistance threshold, two or more but not all of the parallel-coupled transistors initially receive respective gate drive signals.

Example 24 includes the switching power supply of Example 22 or 23, wherein responsive to the ambient temperature being lower than a temperature threshold and/or the RdsOn being lower than an on-resistance threshold, only one of the parallel-coupled transistors initially receives a gate drive signal.

Example 25 is a method for controlling a switching power supply that includes a switching element having two or more parallel-coupled transistors, the method comprising: receiving a pulse width modulation (PWM) control signal; generating a logic control signal that is based on one or both of process strength associated with the switching element and ambient temperature associated with the power supply; responsive to the logic control signal indicating the process strength and/or ambient temperature is beyond a given threshold, initially providing one or more gate drive signals to a first set of the two or more parallel-coupled transistors, respectively, the first set including one or more but not all of the two or more parallel-coupled transistors, and after a delay period providing a respective gate drive signal to each of the two or more parallel-coupled transistors; and responsive to the logic control signal indicating that the process strength and/or ambient temperature is not beyond a given threshold, initially providing one or more gate drive signals to a second set of the two or more parallel-coupled transistors, respectively, the second set having one or more fewer transistors than the first set or one or more different transistors than the first set, and after a delay period providing a respective gate drive signal to each of the two or more parallel-coupled transistors.

Example 26 includes the method of Example 25, wherein the logic control signal that is based on both of the process strength and the ambient temperature.

Example 27 includes the method of Example 26, wherein the logic control signal is determined based on a comparison of the ambient temperature to a threshold that is based on the process strength.

Example 28 includes the method of Example 26, wherein the logic control signal is determined based on a comparison of the process strength to a threshold that is based on the ambient temperature.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end user and/or a third party.

While the use of particular transistors is described herein, other transistors (or equivalent devices) may be used instead. For example, a p-channel field effect transistor (PFET) may be used in place of an n-channel field effect transistor (NFET) with little or no changes to the circuit. Furthermore, other types of transistors may be used (such as bipolar junction transistors (BJTs)). Furthermore, the devices may be implemented in/over a silicon substrate (Si), a silicon carbide substrate (SiC), a gallium nitride substrate (GaN) or a gallium arsenide substrate (GaAs).

References herein to a field effect transistor (FET) being "ON" means that the conduction channel of the FET is present and drain current may flow through the FET. References herein to a FET being "OFF" means that the conduction channel is not present and drain current does not flow through the FET. A FET that is OFF, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. A switching power supply, comprising:
   a switching element having two or more parallel-coupled transistors; and
   a logic circuit having a first logic circuit input, a second logic circuit input, and a logic circuit output, the logic circuit configured to (a) receive at the first logic circuit input a pulse width modulation (PWM) signal, (b) receive at the second logic circuit input a logic control signal that is based on one or more conditions associated with the power supply, and (c) provide from the logic circuit output to a gate of one of the two or more parallel-coupled transistors a gate control signal, wherein:
   the logic circuit includes an AND-gate configured to receive as inputs the PWM signal and the logic control signal, and output an AND-gate output signal; and
   the gate control signal is based on the AND-gate output signal.

2. The switching power supply of claim 1, wherein the logic circuit output is a first logic circuit output and the gate control signal is a first gate control signal, and the logic circuit comprises a second logic circuit output, the logic circuit configured to provide from the second logic circuit output to a gate of a second of the two or more parallel-coupled transistors a second gate control signal that is based only on a delayed version of the PWM signal.

3. The switching power supply of claim 2, further comprising a delay circuit configured to receive the PWM signal and output the delayed version of the PWM signal.

4. The switching power supply of claim 2, wherein the logic circuit comprises a third logic circuit output, the logic circuit configured to provide from the third logic circuit output to a gate of a third of the two or more parallel-coupled transistors a third gate control signal that is based only on the PWM signal.

5. The switching power supply of claim 1, wherein the logic circuit output is a first logic circuit output, the gate control signal is a first gate control signal and the logic control signal is a first logic control signal, and the logic circuit comprises a second logic circuit output, the logic circuit configured to provide from the second logic circuit output to a gate of a second of the two or more parallel-coupled transistors a second gate control signal that is based on the PWM signal and a second logic control signal, the second logic control signal being based on the one or more conditions.

6. The switching power supply of claim 1, wherein the logic circuit output is a first logic circuit output, the gate control signal is a first gate control signal, the logic control signal is a first logic control signal, and the switching element comprise three or more parallel-coupled transistors, and the logic circuit comprises a second logic circuit output, the logic circuit configured to provide from the second logic circuit output to a gate of a second of the three or more parallel-coupled transistors a second gate control signal that is based on the PWM signal and a second logic control signal, the second logic control signal being based on the one or more conditions.

7. The switching power supply of claim 1, further comprising a comparator circuit configured to generate the logic control signal based on the one or more conditions.

8. The switching power supply of claim 7, wherein the one or more conditions include process strength associated with the switching element and ambient temperature associated with the power supply, and the comparator circuit is configured to generate the logic control signal based on both the ambient temperature and the process strength.

9. The switching power supply of claim 8, wherein the comparator circuit comprises:
   a first comparator having a temperature signal input, a temperature reference signal input, and a first comparator output, the first comparator configured to (a) receive at the temperature signal input a signal representative of the ambient temperature, (b) receive at the temperature reference signal input a temperature reference signal, and (c) provide from the first comparator output the logic control signal; and
   a second comparator having a process strength signal input, a process strength reference signal input, and a second comparator output, the second comparator configured to (a) receive at the process strength signal input a signal representative of the process strength, (b) receive at the process strength reference signal input a process strength reference signal, and (c) provide from the second comparator output the temperature reference signal or a control signal by which the temperature reference signal is selected or otherwise based.

10. The switching power supply of claim 7, wherein the comparator circuit comprises:
    a comparator having a first comparator input, a second comparator input, and a comparator output, the comparator configured to (a) receive at the first comparator input a signal representative of the one or more conditions, (b) receive at the second comparator input a reference signal, and (c) provide from the comparator output the logic control signal or another signal by which the logic control signal is selected or otherwise based.

11. The switching power supply of claim 10, wherein the reference signal is provided from a non-volatile memory.

12. The switching power supply of claim 7, wherein the one or more conditions include process strength associated with the switching element and ambient temperature associated with the power supply, and the comparator circuit comprises:
    one or more analog-to-digital (A/D) converters including an A/D converter configured to receive as input an analog signal representative of the ambient temperature and/or an A/D converter configured to receive as input an analog signal representative of the process strength; and
    a look-up table configured to (a) receive as input one or more digital outputs from the one or more A/D converters, and (b) output one or more logic control signals, the one or more logic control signals including the logic control signal that is based on one or both of the process strength and the ambient temperature.

13. The switching power supply of claim 1, wherein the one or more conditions include process strength associated with the switching element and ambient temperature associated with the power supply, and the switching power supply comprises:
    a temperature sensor circuit configured to provide a signal representative of the ambient temperature; and/or
    a process strength sensor circuit configured to provide a signal representative of the process strength.

14. The switching power supply of claim 1, wherein the logic circuit comprises:
a delay circuit configured to receive the PWM signal and output a delayed version of the PWM signal; and
an OR-gate configured to receive as inputs the AND-gate output signal and the delayed version of the PWM signal, and output the gate control signal.

15. The switching power supply of claim 1, wherein the logic circuit is included in an integrated circuit chip that includes at least the first logic circuit input, the second logic circuit input, and the logic circuit output.

16. The switching power supply of claim 15, wherein the one or more conditions include process strength associated with the switching element and ambient temperature associated with the power supply, and the integrated circuit chip comprises a comparator circuit configured to generate the logic control signal based on one or both of the ambient temperature and the process strength.

17. The switching power supply of claim 1, wherein the switching element is one of: a high-side switching element coupled to a voltage supply terminal; or a low-side switching element coupled to a voltage reference terminal.

18. The switching power supply of claim 1, wherein the one or more conditions includes process strength associated with the switching element, and the process strength is represented by an on-resistance of the switching element.

19. The switching power supply of claim 1, wherein the one or more conditions includes one or more of process strength associated with the switching element, ambient temperature associated with the power supply, ringing amplitude associated with the power supply, input voltage associated with the power supply, load current associated with the power supply, and/or switching speed associated with the power supply.

20. The switching power supply of claim 1, wherein the one or more conditions includes one or both of process strength associated with the switching element and ambient temperature associated with the power supply.

21. A buck switching regulator comprising the switching power supply of claim 1.

22. A switching power supply, comprising:
a switching element having a plurality of parallel-coupled transistors; and
a logic circuit configured to (a) initially provide through a first signal path coupled in parallel with a delay circuit a gate drive signal to one of the parallel-coupled transistors, and (b) after a delay period provide through a second signal path coupled in series with the delay circuit a delayed gate drive signal to a second one of the parallel-coupled transistors, the gate drive signal being based on one or both of drain-to-source on-resistance (RdsOn) associated with the switching element and ambient temperature associated with the power supply.

23. The switching power supply of claim 22, wherein:
responsive to the ambient temperature being higher than a temperature threshold and/or the RdsOn being higher than an on-resistance threshold, providing through a third signal path the gate drive signal.

24. A method for controlling a switching power supply that includes a switching element having two or more parallel-coupled transistors, the method comprising:
receiving a pulse width modulation (PWM) control signal;
generating a logic control signal that is based on one or both of process strength associated with the switching element and ambient temperature associated with the power supply;
responsive to the logic control signal indicating that the process strength and/or ambient temperature is beyond a given threshold, initially providing one or more gate drive signals through a signal path coupled in parallel with a delay circuit to a first set of the two or more parallel-coupled transistors, respectively, the first set including one or more but not all of the two or more parallel-coupled transistors, and after a delay period determined by the delay circuit providing through the signal path a respective gate drive signal to each of the two or more parallel-coupled transistors; and
responsive to the logic control signal indicating that the process strength and/or ambient temperature is not beyond the given threshold, initially providing the one or more gate drive signals through the signal path coupled in parallel with the delay circuit to a second set of the two or more parallel-coupled transistors, respectively, the second set having (a) one or more fewer transistors than the first set or (b) one or more different transistors than the first set, and after the delay period providing through the signal path the respective gate drive signal to each of the two or more parallel-coupled transistors.

25. The method of claim 24, wherein the logic control signal that is based on both of the process strength and the ambient temperature.

* * * * *